(12) United States Patent
Ma et al.

(10) Patent No.: US 12,342,672 B2
(45) Date of Patent: *Jun. 24, 2025

(54) ORGANIC LIGHT EMITTING DEVICE AND DISPLAY DEVICE

(71) Applicant: BOE Technology Group Co., Ltd., Beijing (CN)

(72) Inventors: Kun Ma, Beijing (CN); Lei Chen, Beijing (CN); Rongrong Gao, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 848 days.

This patent is subject to a terminal disclaimer.

(21) Appl. No.: 17/610,690

(22) PCT Filed: Jan. 26, 2021

(86) PCT No.: PCT/CN2021/073703
§ 371 (c)(1),
(2) Date: Nov. 11, 2021

(87) PCT Pub. No.: WO2022/160082
PCT Pub. Date: Aug. 4, 2022

(65) Prior Publication Data
US 2023/0125001 A1    Apr. 20, 2023

(51) Int. Cl.
*H10K 50/15* (2023.01)
*H10K 50/11* (2023.01)
(Continued)

(52) U.S. Cl.
CPC ............. *H10K 50/15* (2023.02); *H10K 50/11* (2023.02); *H10K 50/16* (2023.02); *H10K 85/631* (2023.02);
(Continued)

(58) Field of Classification Search
CPC ...................................................... H10K 59/35
See application file for complete search history.

(56) References Cited

U.S. PATENT DOCUMENTS

2009/0261324 A1* 10/2009 Noguchi ............... H10K 50/11
257/40
2009/0309108 A1* 12/2009 Chang .................... H10K 59/35
257/89

(Continued)

FOREIGN PATENT DOCUMENTS

CN        103887444 A    6/2014
CN        107565039 A    1/2018
(Continued)

OTHER PUBLICATIONS

Google Translation of KR 1593368 B1 (Year: 2024).*

*Primary Examiner* — Michael M Dollinger
(74) *Attorney, Agent, or Firm* — Ling Wu; Stephen Yang; Ling and Yang Intellectual Property

(57) ABSTRACT

The present disclosure provides an organic light emitting device, including a first electrode, a second electrode and an emitting layer disposed between the first electrode and the second electrode. A hole transporting layer is disposed between the first electrode and the emitting layer. An electron transporting layer is disposed between the second electrode and the emitting layer. The ratio of the hole mobility of the hole transporting layer to the electron mobility of the electron transporting layer is about 10 to 500.

16 Claims, 4 Drawing Sheets

(51) Int. Cl.
*H10K 50/16* (2023.01)
*H10K 85/60* (2023.01)
*H10K 101/40* (2023.01)

(52) U.S. Cl.
CPC ....... *H10K 85/654* (2023.02); *H10K 85/6574* (2023.02); *H10K 2101/40* (2023.02)

(56) References Cited

U.S. PATENT DOCUMENTS

| | | | |
|---|---|---|---|
| 2013/0270531 A1* | 10/2013 | Seo | H10K 50/81 257/40 |
| 2015/0188075 A1* | 7/2015 | Kim | H10K 50/166 257/40 |
| 2018/0026219 A1 | 1/2018 | Li et al. | |
| 2018/0366683 A1* | 12/2018 | Zhang | H10K 59/35 |
| 2019/0214571 A1* | 7/2019 | Huh | C07D 405/10 |
| 2019/0296243 A1* | 9/2019 | Suh | H10K 85/615 |
| 2021/0249621 A1 | 8/2021 | Chen | |
| 2022/0255017 A1* | 8/2022 | Lee | H10K 85/654 |
| 2023/0232651 A1* | 7/2023 | Gao | H10K 50/18 257/40 |
| 2024/0237510 A1* | 7/2024 | Gao | H10K 85/626 |

FOREIGN PATENT DOCUMENTS

| | | |
|---|---|---|
| CN | 107644940 A | 1/2018 |
| CN | 108586368 A | 9/2018 |
| CN | 108832025 A | 11/2018 |
| CN | 109166975 A | 1/2019 |
| CN | 109585668 A | 4/2019 |
| CN | 109686847 A | 4/2019 |
| CN | 111490070 A | 8/2020 |
| KR | 101593368 B1 * | 2/2016 |
| WO | 2005004193 A2 | 1/2005 |

* cited by examiner

ORGANIC LIGHT EMITTING DEVICE AND DISPLAY DEVICE

TECHNICAL FIELD

The present disclosure relates to but is not limited to the field of display technology, in particular to an organic light emitting device and a display device.

BACKGROUND

As a new type of flat panel display device, Organic Light Emitting Devices (OLEDs) have attracted more and more attention. An OLED is an active light emitting device, which has the advantages of high brightness, color saturation, ultra-thinness, wide angle of view, low power consumption, extremely high response speed, and flexibility.

An OLED includes an anode, a cathode, and an emitting layer disposed between the anode and the cathode. The light emitting principle of the OLED is that holes and electrons are injected into the emitting layer from the anode and the cathode respectively. When the electrons and the holes meet in the emitting layer, the electrons and the holes are recombined to produce excitons. These excitons emit light when they change from an excited state to a ground state.

SUMMARY

The following is a brief description of the subject matter described in detail in the present disclosure. This brief description is not intended to limit the scope of protection of the claims.

The embodiment of the present disclosure provides an organic light emitting device and a display device.

In one aspect, the embodiment of the present disclosure provides an organic light emitting device, including: a first electrode, a second electrode and an emitting layer disposed between the first electrode and the second electrode, wherein a hole transporting layer is disposed between the first electrode and the emitting layer, and an electron transporting layer is disposed between the second electrode and the emitting layer; the ratio of the hole mobility of the hole transporting layer to the electron mobility of the electron transporting layer is about 10 to 500.

In some exemplary embodiments, the hole mobility of the hole transporting layer is about $5*10^{-5}$ cm$^2$/Vs to $9*10^{-4}$ cm$^2$/Vs.

In some exemplary embodiments, the electron mobility of the electron transporting layer is about $1*10^{-6}$ cm$^2$/Vs to $5*10^{-5}$ cm$^2$/Vs.

In some exemplary embodiments, the Highest Occupied Molecular Orbit HOMO energy level difference between the hole transporting layer and an adjacent layer on the side far away from the first electrode is greater than the Lowest Unoccupied Molecular Orbit LUMO energy level difference between the electron transporting layer and an adjacent layer on the side far away from the second electrode.

In some exemplary embodiments, the HOMO energy level difference between the hole transporting layer and the adjacent layer on the side far away from the first electrode is about 0.1 eV to 0.6 eV.

In some exemplary embodiments, the LUMO energy level difference between the electron transporting layer and the adjacent layer on the side far away from the second electrode is about 0.2 eV to 0.7 eV.

In some exemplary embodiments, the material of the electron transporting layer includes a compound having the following structural formula:

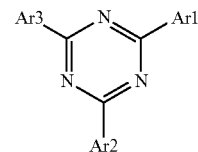

where Ar1, Ar2 and Ar3 are respectively and independently hydrogen, or deuterium, or substituted or unsubstituted alkyl group with 1 to 40 carbon atoms, or substituted or unsubstituted aryl group with 6 to 60 carbon atoms, or are combined with adjacent substituent groups to form substituted or unsubstituted benzene rings;

Ar3 includes the following structural formula:

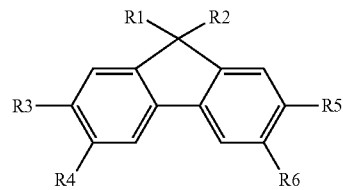

R1 to R6 are respectively and independently one of the following: H, alkyl group with 1 to 6 carbon atoms, amino group, arylam group, substituted or unsubstituted aryl group with 6 to 30 carbon atoms, or substituted or unsubstituted oxyheteroaryl group with 3 to 20 carbon atoms.

In some exemplary embodiments, R1 and R2 are interconnected to form a saturated or unsaturated cyclic compound.

In some exemplary embodiments, the material of the hole transporting layer includes a compound having the following structural formula:

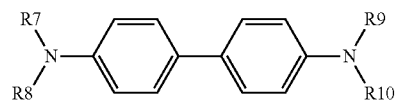

R7 to R10 are respectively and independently one of the following: substituted or unsubstituted aryl group with 6 to 30 carbon atoms, substituted or unsubstituted heteroaryl group with 3 to 30 carbon atoms, substituted or unsubstituted alkyl group with 1 to 20 carbon atoms, and substituted or unsubstituted cycloalkyl group with 1 to 20 carbon atoms.

In some exemplary embodiments, R7 to R10 are at least partially the same or different from each other.

In some exemplary embodiments, the material of the hole transporting layer includes one or more compounds having the following structural formulas:

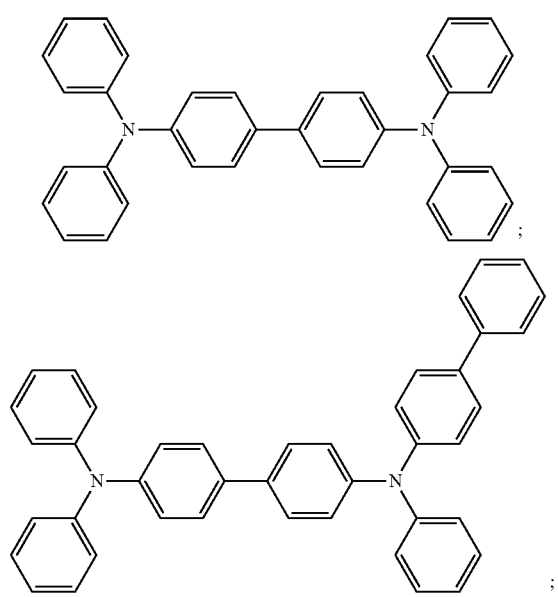
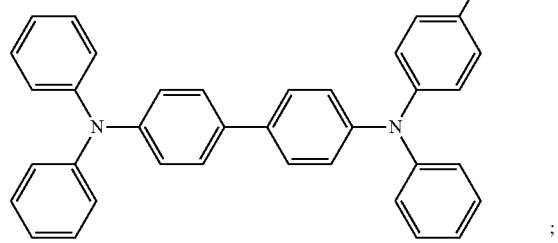
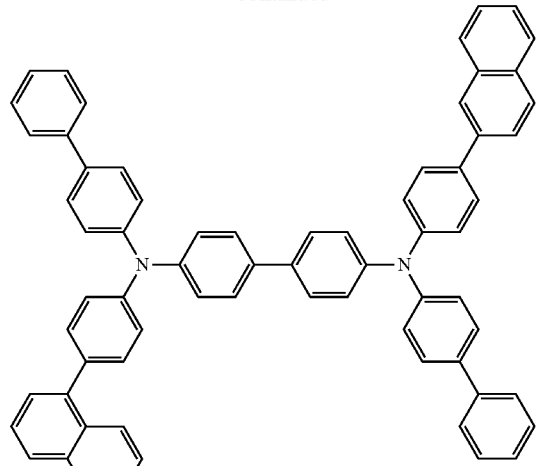
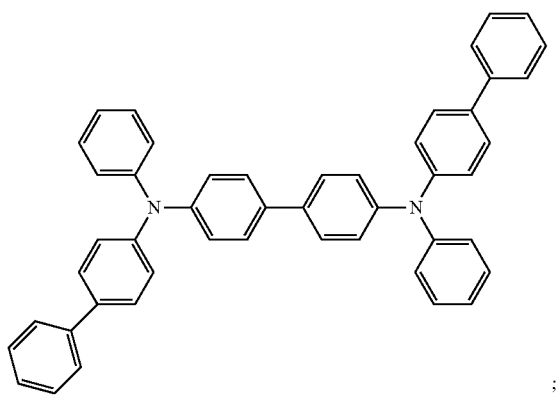
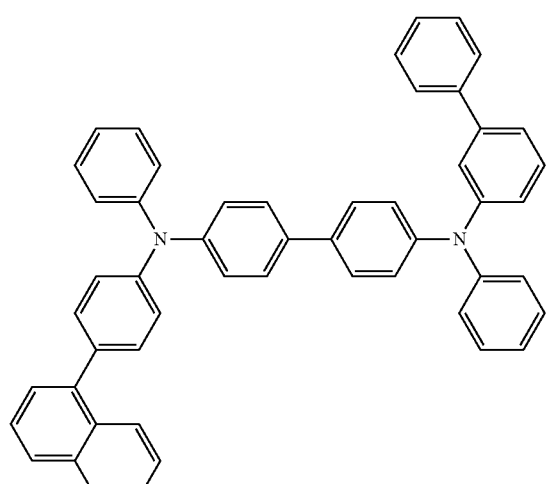
In some exemplary embodiments, the material of the electron transporting layer includes one or more compounds having the following structural formulas:
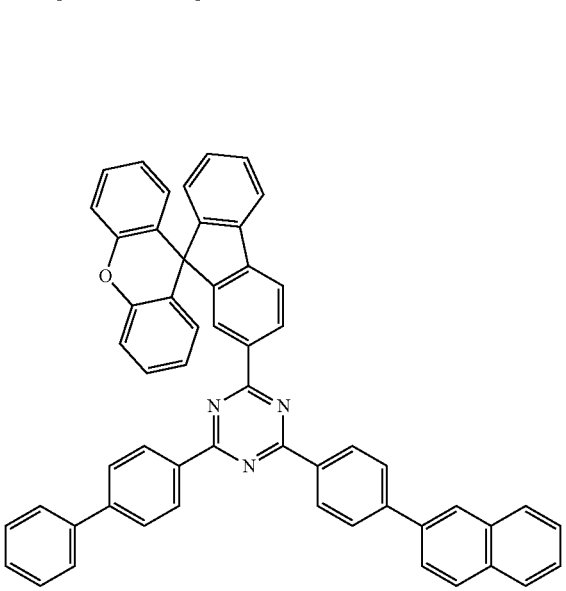

-continued

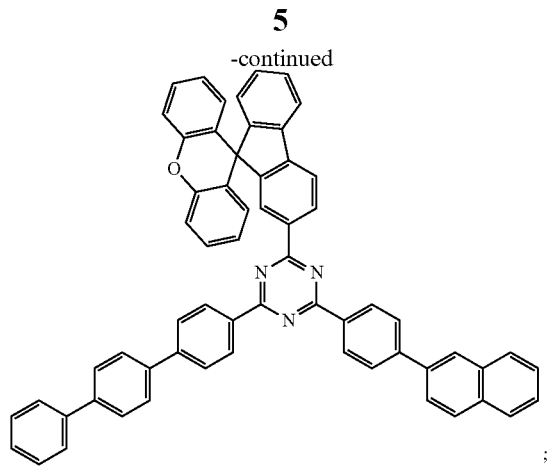

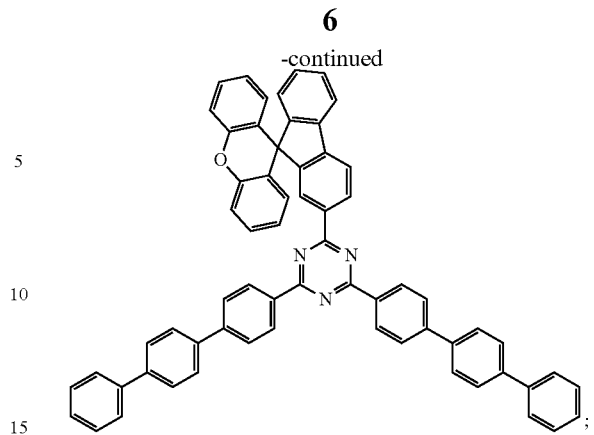

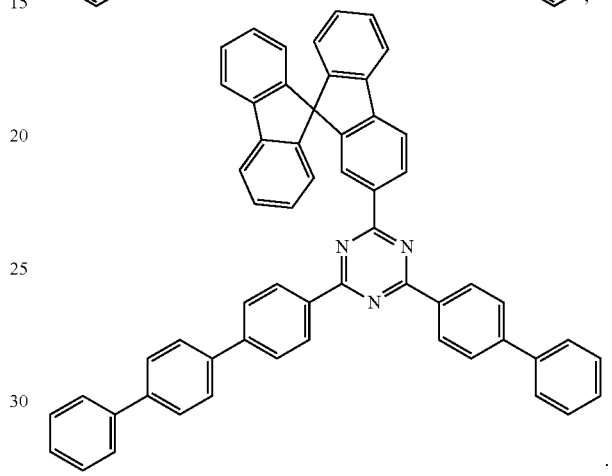

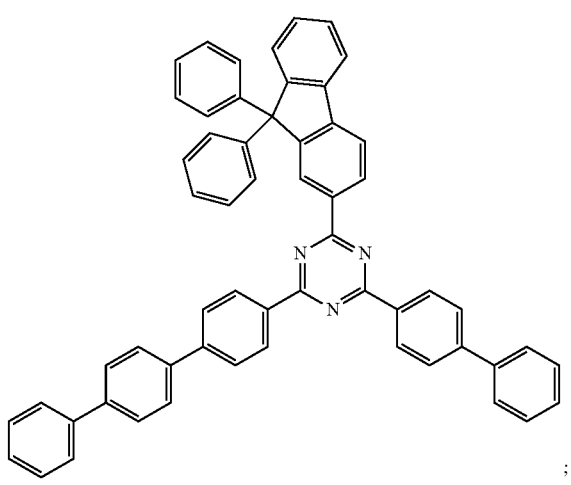

In another aspect, the embodiment of the present disclosure provides a display device, including the organic light emitting device described above.

In some exemplary embodiments, the display device includes a first organic light emitting device emitting red light, a second organic light emitting device emitting green light, and a third organic light emitting device emitting blue light.

In some exemplary embodiments, the electron mobility of the emitting layer of the third organic light emitting device is greater than the electron mobility of the emitting layer of the first organic light emitting device, and the electron mobility of the emitting layer of the first organic light emitting device is greater than the electron mobility of the emitting layer of the second organic light emitting device; the hole mobility of the emitting layer of the second organic light emitting device is greater than the hole mobility of the emitting layer of the first organic light emitting device, and the hole mobility of the emitting layer of the first organic light emitting device is greater than the hole mobility of the emitting layer of the third organic light emitting device.

In some exemplary embodiments, the drive voltage of the third organic light emitting device is greater than the drive voltage of the second organic light emitting device, and the drive voltage of the second organic light emitting device is greater than the drive voltage of the first organic light emitting device.

In some exemplary embodiments, the luminous efficiency of the second organic light emitting device is greater than luminous efficiency of the first organic light emitting device, and the luminous efficiency of the first organic light emitting device is greater than luminous efficiency of the third organic light emitting device.

After reading and understanding the drawings and the detailed description, other aspects may be understood.

BRIEF DESCRIPTION OF DRAWINGS

The drawings are used to provide a further understanding of the technical solution of the present disclosure, constitute a part of the description, are used together with the embodiments of the present disclosure to explain the technical solution of the present disclosure, and do not constitute limitations to the technical solution of the present disclosure. The shape and size of each component in the drawings do not reflect the actual scale, and the purpose is only to schematically illustrate the contents of the present disclosure.

DETAILED DESCRIPTION

Figure 1:
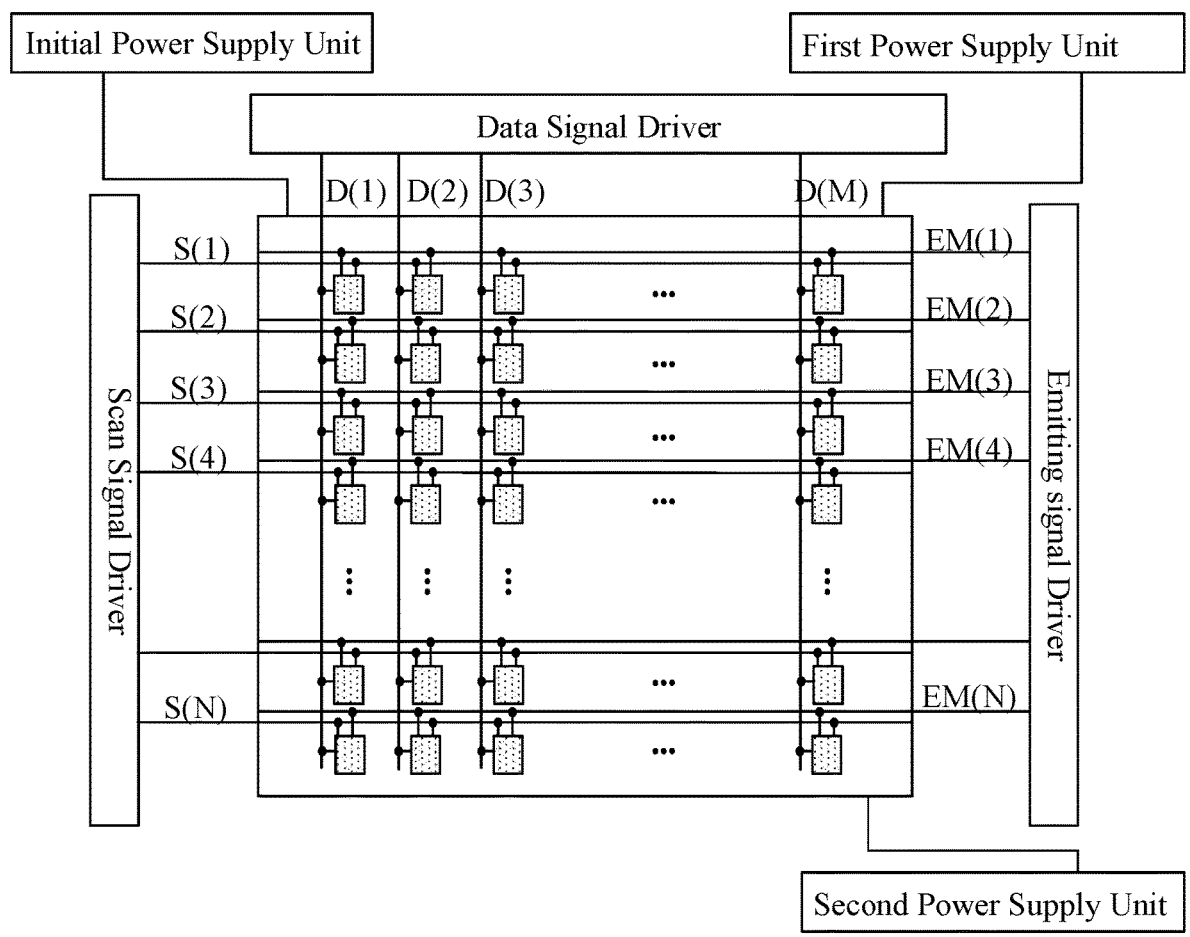
FIG. 1 illustrates a schematic diagram of a structure of a display device.

The embodiments herein may be implemented in a plurality of different forms. Those skilled in the art can easily understand the fact that the embodiments and content may be transformed into various forms without departing from the purpose and scope of the present disclosure. Therefore, the present disclosure should not be interpreted as limited to the content recorded in the following embodiments. Without conflict, the embodiments in the present disclosure and the features in the embodiments may be freely combined with each other.

In the drawings, sometimes the size of the constituent elements, the thickness or region of the layer may be exaggerated for the sake of clarity. Therefore, any implementation of the present disclosure is not necessarily limited to the size illustrated in the drawing, and the shape and size of the components in the drawing do not reflect the actual scale. In addition, the drawings schematically illustrate ideal examples, and any implementation of the present disclosure is not limited to the shape or value illustrated in the drawings.

The ordinal numerals such as "first", "second" and "third" herein are set up to avoid the confusion of the constituent elements, not to limit the quantity. Herein, "a plurality of" represents a number of two or more than two.

Herein, for the sake of convenience, "middle", "up", "down", "front", "back", "vertical", "horizontal", "top", "bottom", "inside", "outside" and other words indicating an orientation or positional relationship are used to describe the positional relationship of constituent elements with reference to the drawings, only for the convenience of describing the embodiments and simplifying the description, rather than indicating or implying that the device or element must have a specific orientation or be constructed and operated in a specific orientation, so they should not be understood as limitations to the present disclosure. The positional relationship of the constituent elements may be appropriately changed according to the direction of the described constituent elements. Therefore, it is not limited to the words and sentences described herein, and can be changed appropriately according to the situation.

Herein, unless otherwise specified and limited, the terms "mount", "connected" and "connect" shall be understood in a broad sense. For example, it may be fixed connection, removable connection, or integrated connection; it may be mechanical connection or electrical connection; it may be direct connection, indirect connection through an intermediate component, or communication inside two components. For those skilled in the art, the meanings of the above terms in the present disclosure may be understood according to the situation.

Herein, a transistor refers to a component which includes at least three terminals, i.e., a gate electrode, a drain electrode and a source electrode. A transistor has a channel region between the drain electrode (or drain electrode terminal, drain region or drain electrode) and the source electrode (or source electrode terminal, source region or source electrode), and the current can flow through the drain electrode, the channel region and the source electrode. Herein, the channel region refers to the region where the current mainly flows.

Herein, a first electrode may be a drain electrode and a second electrode may be a source electrode, or a first electrode may be a source electrode and a second electrode may be a drain electrode. The functions of "source electrode" and "drain electrode" may sometimes be exchanged when transistors of opposite polarity are used or when the current direction changes during circuit operation. Therefore, herein "source electrode" and "drain electrode" may be exchanged with each other.

Herein, "electrical connection" includes the case where constituent elements are connected together by a component having a certain electrical action. As long as electrical signals between the connected constituent elements can be received by "component having a certain electrical action", there is no special limitation thereto. "Component having a certain electrical action", for example, may be an electrode or wiring, or a switching element such as a transistor, or other functional element such as a resistor, an inductor or a capacitor.

Herein, "parallel" refers to a state in which an angle formed by two straight lines is more than $-10°$ and less than $10°$. Therefore, it also includes a state in which an angle is more than $-5°$ and less than $5°$. In addition, "vertical" refers to a state in which an angle formed by two straight lines is more than $80°$ and less than $100°$. Therefore, it also includes a state in which an angle is more than $85°$ and less than $95°$.

Herein, "film" and "layer" may be exchanged. For example, sometimes "conducting layer" may be replaced by "conducting film". Similarly, sometimes "insulating film" may be replaced by "insulating layer".

Herein "about" refers to a numerical value within a range of allowable process and measurement errors without strictly limiting the limit.

FIG. 1 illustrates a schematic diagram of a structure of a display device. Referring to FIG. 1, the display device may include a scan signal driver, a data signal driver, an emitting signal driver, a display substrate, a first power supply unit, a second power supply unit and an initial power supply unit. In some exemplary embodiments, the display substrate at least includes a plurality of scan signal lines (S(1) to S(N)), a plurality of data signal lines (D(1) to D(M)) and a plurality of emitting signal lines (EM(1) to EM(N)). The scan signal driver is configured to sequentially provide scan signals to the plurality of scan signal lines (S(1) to S(N)), the data signal driver is configured to sequentially provide data signals to the plurality of data signal lines (D(1) to D(M)), and the emitting signal driver is configured to sequentially provide light emitting control signals to the plurality of emitting signal lines (EM(1) to EM(N)). In some exemplary embodiments, the plurality of scan signal lines and the plurality of emitting signal lines extend along a horizontal direction, and a plurality of data signal lines extend in a vertical direction. The display substrate includes a plurality of sub-pixels. Each sub-pixel includes a pixel drive circuit and a light emitting device. The pixel drive circuit is connected with the scan signal lines, the light emitting control lines and the data signal lines, and is configured to receive data voltage transmitted by the data signal lines and output corresponding current to the light emitting device under the control of the scan signal lines and the emitting signal lines. The light emitting device is connected with the pixel drive circuit, and is configured to emit light of corresponding brightness in response to the current output by the pixel drive circuit. The first power supply unit, the second power supply unit and the initial power supply unit are respectively configured to provide first power supply voltage, second power supply voltage and initial power supply voltage to the pixel drive circuit through the first power supply lines, the second power supply lines and the initial signal lines.

Figure 2:
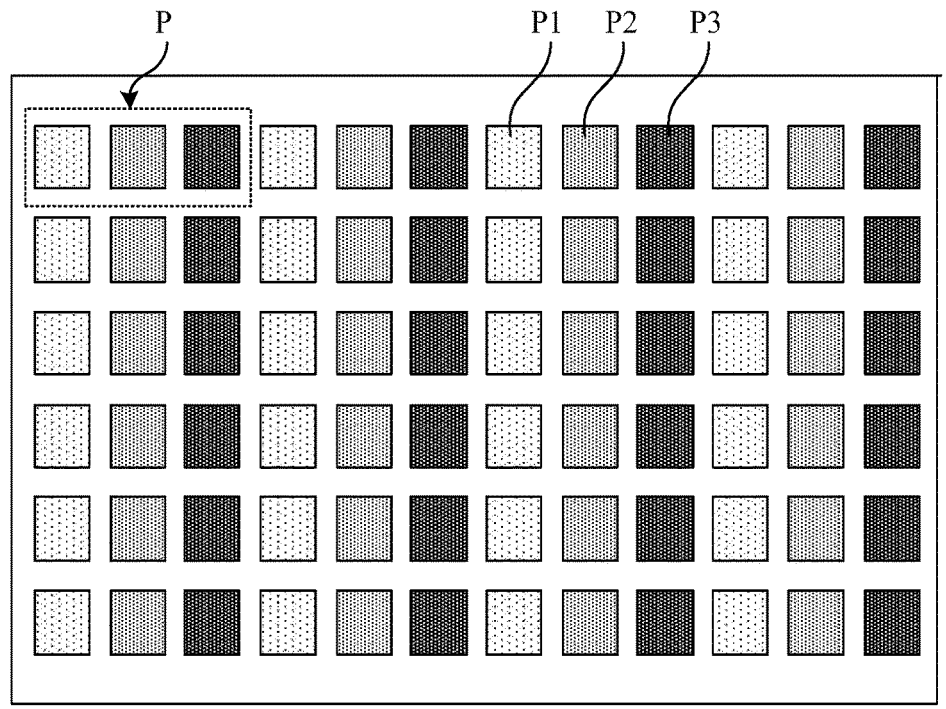
FIG. 2 illustrates a schematic diagram of a planar structure of a display substrate.

FIG. 2 illustrates a schematic diagram of a planar structure of a display substrate. Referring to FIG. 2, a display region may include a plurality of pixel units P arranged in an array. At least one of the plurality of pixel units P includes a first sub-pixel P1 emitting first-color light, a second sub-pixel P2 emitting second-color light, and a third sub-pixel P3 emitting third-color light. The first sub-pixel P1, the second sub-pixel P2 and the third sub-pixel P3 each include a pixel drive circuit and a light emitting device. In some exemplary embodiments, the pixel unit P may include a red (R) sub-pixel, a green (G) sub-pixel, and a blue (B) sub-pixel, or may include a red sub-pixel, a green sub-pixel, a blue sub-pixel, and a white (W) sub-pixel, which is not limited in the present disclosure. In some exemplary embodiments, the shape of the sub-pixels in the pixel unit may be a rectangular shape, a diamond, a pentagonal shape, or a hexagonal shape. When the pixel unit includes three sub-pixels, the three sub-pixels may be arranged in parallel horizontally, in parallel vertically or in a triangle shape. When the pixel unit includes four sub-pixels, the four sub-pixels may be arranged in parallel horizontally, in parallel vertically or in a square shape. However, the present disclosure is not limited thereto.

Figure 3:
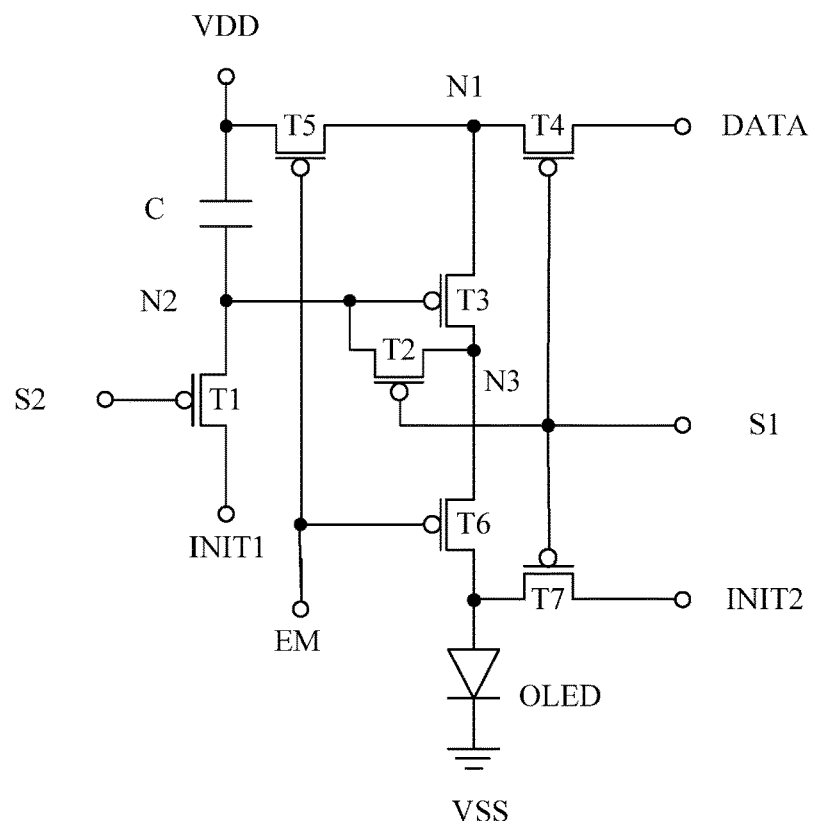
FIG. 3 illustrates an equivalent circuit diagram of a pixel drive circuit.

In some exemplary embodiments, the pixel drive circuit may be a 3T1C, 4T1C, 5T1C, 5T2C, 6T1C, or 7T1C structure. FIG. 3 illustrates an equivalent circuit diagram of a pixel drive circuit. Referring to FIG. 3, the pixel drive circuit may include seven switching transistors (first transistor T1 to seventh transistor T7), one storage capacitor C and eight signal lines (data signal line DATA, first scan signal line S1, second scan signal line S2, first initial signal line INIT1, second initial signal line INIT2, first power supply line VSS, second power supply line VDD and emitting signal line EM). The first initial signal line INIT1 and the second initial signal line INIT2 may be the same signal line.

In some exemplary embodiments, a control electrode of the first transistor T1 is connected with the second scan signal line S2, a first electrode of the first transistor T1 is connected with the first initial signal line INIT1, and a second electrode of the first transistor T1 is connected with a second node N2. A control electrode of the second transistor T2 is connected with the first scan signal line S1, a first electrode of the second transistor T2 is connected with the second node N2, and a second electrode of the second transistor T2 is connected with a third node N3. A control electrode of the third transistor T3 is connected with the second node N2, a first electrode of the third transistor T3 is connected with the first node N1, and a second electrode of the third transistor T3 is connected with the third node N3. A control electrode of the fourth transistor T4 is connected with the first scan signal line S1, a first electrode of the fourth transistor T4 is connected with the data signal line DATA, and a second electrode of the fourth transistor T4 is connected with the first node N1. A control electrode of the fifth transistor T5 is connected with the emitting signal line EM, a first electrode of the fifth transistor T5 is connected with the second power supply line VDD, and a second electrode of the fifth transistor T5 is connected with the first node N1. A control electrode of the sixth transistor T6 is connected with the emitting signal line EM, a first electrode of the sixth transistor T6 is connected with the third node N3, and a second electrode of the sixth transistor T6 is connected with the first electrode of the light emitting device. A control electrode of the seventh transistor T7 is connected with the first scan signal line S1, a first electrode of the seventh transistor T7 is connected with the second initial signal line INIT2, and a second electrode of the seventh transistor T7 is connected with the first electrode of the light emitting device. A first end of the storage capacitor C is connected with the second power supply line VDD, and a second end of the storage capacitor C is connected with the second node N2.

In some exemplary embodiments, the first transistor T1 to the seventh transistor T7 may be P-type transistors or may be N-type transistors. Using the same type of transistors in the pixel drive circuit can simplify the process flow, reduce the process difficulty of the display panel, and improve the yield of the product. In some possible embodiments, the first transistor T1 to the seventh transistor T7 may include P-type transistors and N-type transistors.

In some exemplary embodiments, the second electrode of the light emitting device is connected with the first power supply line VSS. The signal of the first power supply line VSS is a low-level signal and the signal of the second power supply line VDD is a continuously provided high-level signal. The first scan signal line S1 is a scan signal line in the pixel drive circuit of a current display line, and the second scan signal line S2 is a scan signal line in the pixel drive circuit of a previous display line, that is, for the nth display line, the first scan signal line S1 is S(n) and the second scan signal line S2 is S(n-1). The second scan signal line S2 of the current display line and the first scan signal line S1 of the pixel drive circuit of the previous display line are the same signal line, thus reducing the number of the signal lines of the display panel and realizing the narrow frame of the display panel.

Figure 4:
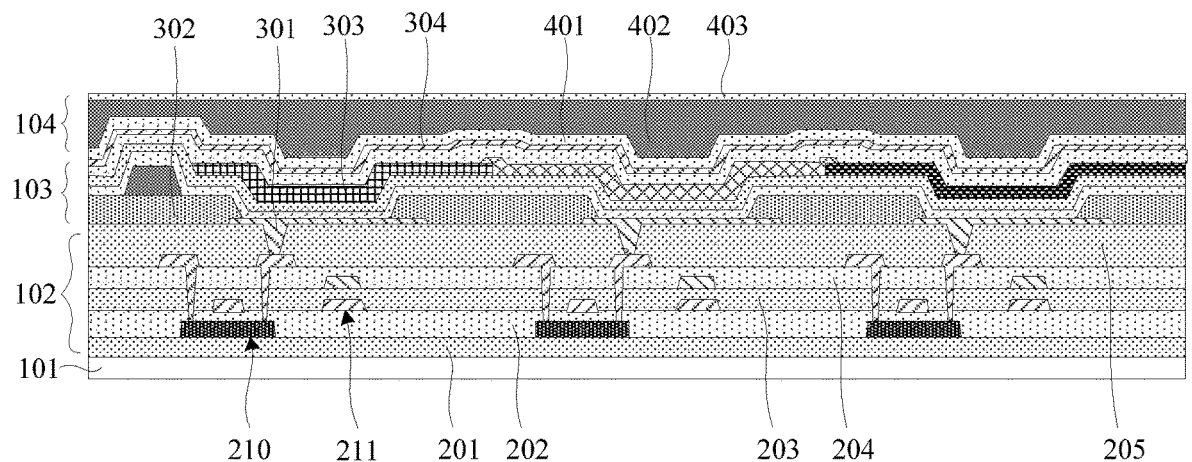
FIG. 4 illustrates a schematic diagram of a sectional structure of a display substrate.

FIG. 4 is a schematic diagram of a sectional structure of a display substrate, illustrating a structure of three sub-pixels of the display substrate. Referring to FIG. 4, on a plane perpendicular to the display substrate, the display substrate may include a drive circuit layer 102 disposed on a substrate 101, a light emitting device 103 disposed on the side of the drive circuit layer 102 far away from the substrate 101, and a packaging layer 104 disposed on the side of the light emitting device 103 far away from the substrate 101. In some possible embodiments, the display substrate may include other film layers, such as post spacers, which is not limited in the present disclosure.

In some exemplary embodiments, the substrate 101 may be a flexible substrate or may be a rigid substrate. The flexible substrate may include a first flexible material layer, a first inorganic material layer, a semiconductor layer, a second flexible material layer and a second inorganic material layer stacked. The materials of the first flexible material layer and the second flexible material layer may be polyimide (PI), polyethylene terephthalate (PET) or polymer soft film after surface treatment. The materials of the first inorganic material layer and the second inorganic material layer may be silicon nitride (SiNx) or silicon oxide (SiOx), so as to improve the water oxygen resistance of the substrate. The material of the semiconductor layer may be amorphous silicon (a-si).

In some exemplary embodiments, the drive circuit layer 102 of each sub-pixel may include a plurality of transistors and a storage capacitor forming the pixel drive circuit. In FIG. 4, illustration is given by taking each sub-pixel including a drive transistor and a storage capacitor as an example. In some possible embodiments, the drive circuit layer 102 of each sub-pixel may include a first insulating layer 201 disposed on the substrate; an active layer disposed on the first insulating layer; a second insulating layer 202 covering the active layer; a gate electrode and a first capacitor electrode disposed on the second insulating layer 202; a third insulating layer 203 covering the gate electrode and the first capacitor electrode; a second capacitor electrode disposed on the third insulating layer 203; a fourth insulating layer 204 covering the second capacitor electrode, the second insulating layer 202, the third insulating layer 203 and the fourth insulating layer 204 being provided with vias exposing the active layer; a source electrode and a drain electrode disposed on the fourth insulating layer 204, the source electrode and the drain electrode being respectively connected with the active layer through vias; a flat layer 205 covering the structure and provided with vias exposing the drain electrode. The active layer, the gate electrode, the source electrode and the drain electrode form a drive transistor 210. The first capacitor electrode and the second capacitor electrode form a storage capacitor 211.

In some exemplary embodiments, the light emitting device 103 may include an anode 301, a pixel definition layer 302, an organic emitting layer 303, and a cathode 304. The anode 301 is disposed on the flat layer 205, and is connected with the drain electrode of the drive transistor 210 through a via opened in the flat layer 205. The pixel definition layer 302 is disposed on the anode 301 and the flat layer 205 and is provided with a pixel opening exposing the anode 301. The organic emitting layer 303 is at least partially disposed in the pixel opening, and is connected with the anode 301. The cathode 304 is disposed on the organic emitting layer 303 and is connected with the organic emitting layer 303. The organic emitting layer 303 emits light of corresponding colors under the drive of the anode 301 and the cathode 304.

In some exemplary embodiments, the packaging layer 104 may include a first packaging layer 401, a second packaging layer 402 and a third packaging layer 403 which are stacked. The first packaging layer 401 and the third packaging layer 403 may be made of an inorganic material, the second packaging layer 402 may be made of an organic material, and the second packaging layer 402 is disposed between the first packaging layer 401 and the third packaging layer 403 to ensure that external water vapor cannot enter the light emitting device 103.

In some exemplary embodiments, the organic emitting layer of the light emitting device may include one or more of an Emitting Layer (EML), a Hole Injection Layer (HIL), a Hole transporting layer (HTL), a Hole blocking layer (HBL), an Electron blocking layer (EBL), an Electron Injection Layer (EIL), and an Electron transporting layer (ETL). Under the drive of the voltage of the anode and the cathode, light is emitted according to the required gray scale by using the light emitting property of the organic material.

In some exemplary embodiments, the emitting layers of OLED light emitting devices of different colors are different. For example, a red light emitting device includes a red emitting layer, a green light emitting device includes a green emitting layer, and a blue light emitting device includes a blue emitting layer. In order to reduce the difficulty of the process and improve the yield, the hole injection layer and hole transporting layer on one side of the emitting layer may adopt a connected layer, and the electron injection layer and the electron transporting layer on the other side of the emitting layer may adopt a connected layer. In some exemplary embodiments, any one or more of the hole injection layer, hole transporting layer, electron injection layer and electron transporting layer may be made through a one-time process (one-time evaporation process or one-time inkjet printing process), which, however, are isolated by the formed film layer surface segment difference or by means of surface treatment. For example, any one or more of the hole injection layers, hole transporting layers, electron injection layers and electron transporting layers corresponding to adjacent sub-pixels may be isolated. In some exemplary embodiments, the organic emitting layer may be formed by adopting Fine Metal Mask (FMM) or open mask evaporation or by adopting an inkjet process.

Moreover, with the continuous development of products, the market requires higher resolution of products, higher brightness of independent sub-pixels and lower power consumption of products. Therefore, higher requirements are attached to the efficiency, brightness, voltage and service life of the device.

Research results show that the service life decay of single-color light emitting elements in OLED is mainly caused by interface degradation and material defects. The main reason for interface deterioration is that the energy barrier at the interface is too large and the accumulated charges are too many. For example, the interfaces on the two sides of the emitting layer are the key interfaces for hole and electron injection into the emitting layer. The energy level matching of the two interfaces is easy to cause carrier accumulation. This charge accumulation is easy to lead to interface degradation and accelerate the service life decay of the device. The main reason for material defects is the distortion of the bond or the fracture of the bond. For example, the more easily deteriorated material in OLED is the material of the electron blocking layer. Since the exciton recombination region of the emitting layer is mainly concentrated at the interface between the electron blocking layer and the emitting layer, too many electrons accumulate at the interface. Usually, the material of the electron blocking layer itself is the material of the electron-rich system and contains the structure of phenylamine. Too many accumulated electrons will produce a repulsive force with the rich electrons of the electron blocking layer itself, which will cause benzene ring & bond distortion on phenylamine. The result of & bond distortion caused by external force is bond fracture, resulting in material defects and rapid service life decay of device.

Figure 5:
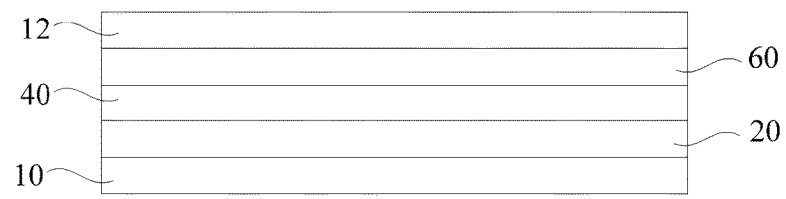
FIG. 5 illustrates a schematic diagram of a structure of an OLED according to at least one embodiment of the present disclosure.

FIG. 5 illustrates a schematic diagram of a structure of an OLED according to at least one embodiment of the present disclosure. Referring to FIG. 5, the OLED provided by this exemplary embodiment includes a first electrode 10, a second electrode 12 and an organic emitting layer disposed between the first electrode 10 and the second electrode 12. In some exemplary embodiments, the first electrode 10 is an anode and the second electrode 12 is a cathode. The organic emitting layer includes a hole transporting layer 20, an emitting layer 40 and an electron transporting layer 60. The hole transporting layer 20 is located between the first electrode 10 and the emitting layer 40, and the electron transporting layer 60 is located between the second electrode 12 and the emitting layer 40. The hole transporting layer 20 is configured to achieve directional and orderly controlled migration of injected holes. The electron transporting layer 60 is configured to achieve directional and orderly controlled migration of injected electrons. The emitting layer 40 is configured to make electrons and holes recombined to emit light.

In some exemplary embodiments, the ratio of the hole mobility of the hole transporting layer to the electron mobility of the electron transporting layer is about 10 to 500. The hole mobility of the hole transporting layer is greater than the electron mobility of the electron transporting layer. In this exemplary embodiment, by setting the relationship between the hole mobility of the hole transporting layer and the electron mobility of the electron transporting layer, it helps to transmit carriers to the emitting layer, increase the hole concentration in the emitting layer, and regulate the movement of the exciton recombination region to the center of the emitting layer, so as to improve the service life of OLED and improve the luminous efficiency.

In some exemplary embodiments, the hole mobility of the hole transporting layer is about $5*10^{-5}$ cm$^2$/Vs to $9*10^{-4}$ cm$^2$/Vs.

In some exemplary embodiments, the electron mobility of the electron transporting layer is about $1*10^{-6}$ cm$^2$/Vs to $5*10^{-5}$ cm$^2$/Vs.

In some exemplary embodiments, the Highest Occupied Molecular Orbit (HOMO) energy level difference between the hole transporting layer and an adjacent layer on the side far away from the first electrode is greater than the Lowest Unoccupied Molecular Orbit (LUMO) energy level difference between the electron transporting layer and an adjacent layer on the side far away from the second electrode. In some examples, referring to FIG. 5, the adjacent layer on the side of the hole transporting layer 20 far away from the first electrode 10 is the emitting layer 40, and the adjacent layer on the side of the electron transporting layer 60 far away from the second electrode 12 is the emitting layer 40. The HOMO energy level difference between the hole transporting layer 20 and the emitting layer 40 is greater than the LUMO energy level difference between the electron transporting layer 60 and the emitting layer 40. In this exemplary embodiment, by setting the HOMO energy level relationship between the hole transporting layer and the emitting layer and the LUMO energy level relationship between the electron transporting layer and the emitting layer, the energy level gap between the hole transporting layer and the emitting layer can be reduced, the hole transport performance can be improved, the hole concentration in the emitting layer can be increased, and the movement of the exciton recombination region to the center of the emitting layer can be regulated, thus improving the service life of OLED and improving the luminous efficiency.

In some exemplary embodiments, the HOMO energy level difference between the hole transporting layer and the adjacent layer on the side far away from the first electrode is about 0.1 eV to 0.6 eV.

In some exemplary embodiments, the LUMO energy level difference between the electron transporting layer and the adjacent layer on the side far away from the second electrode is about 0.2 eV to 0.7 eV.

In some exemplary embodiments, the HOMO energy level and the LUMO energy level may be measured by a photoelectron spectrophotometer (AC3/AC2), ultraviolet (UV) spectroscopy or the like. The electron mobility and the hole mobility may be measured by adopting a Space Charge Limited Current (SCLC) method.

In an OLED structure, the exciton recombination region is mainly concentrated at the interface between the emitting layer and the electron blocking layer, resulting in the accumulation of too many electrons at the interface. Since the accumulated electrons will lead to the cracking of the material of the electron blocking layer, the stability and service life of the material are reduced. By reasonably matching the mobility relationship or energy level and mobility relationship between the hole transporting layer and the electron transporting layer, the exemplary embodiment of the present disclosure optimizes the interface from the energy level matching structure, which is conducive to the transmission of carriers to the center of the emitting layer, reduces the carrier accumulation at the interface, increases the hole concentration in the emitting layer, and moves the exciton recombination region to the center of the emitting layer, enables the exciton recombination region to be far away from the interface of the emitting layer, reduces the material deterioration and performance degradation caused by the accumulation of electrons at the interface of the emitting layer, improves the service life of the device and improves the luminous efficiency.

In some exemplary embodiments, the material of the hole transporting layer includes a compound having the following structural formula:

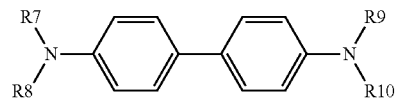

where R7 to R10 are respectively and independently one of the following: substituted or unsubstituted aryl group with 6 to 30 carbon atoms, substituted or unsubstituted heteroaryl group with 3 to 30 carbon atoms, substituted or unsubstituted alkyl group with 1 to 20 carbon atoms, and substituted or unsubstituted cycloalkyl group with 1 to 20 carbon atoms.

In some exemplary embodiments, R7 to R10 are at least partially the same or different from each other. For example, R7 to R10 are the same or not the same, or at least two of them are the same. However, this embodiment is not limited thereto.

In some exemplary embodiments, the material of the hole transporting layer includes, but is not limited to, compounds having structures expressed by formula 1-1 to formula 1-6:

Formula 1-1

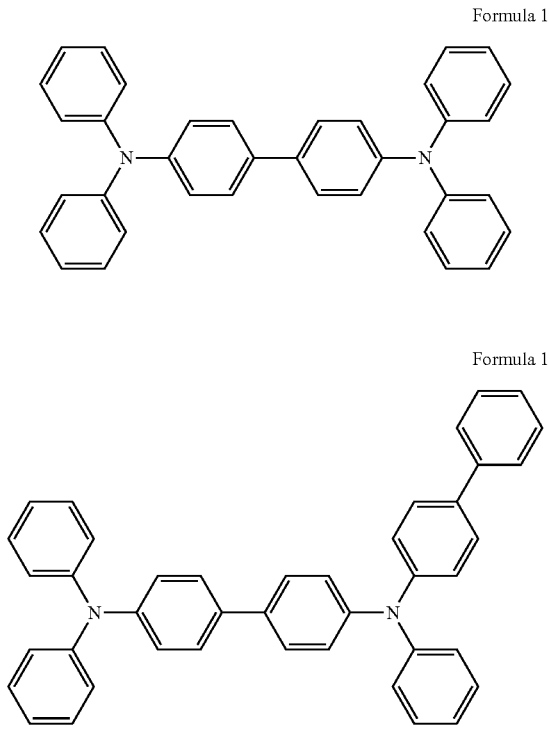

Formula 1-2

Formula 1-3

Formula 1-4

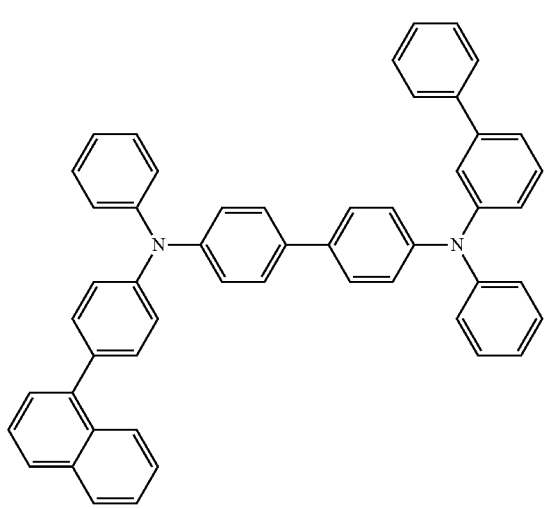

Formula 1-5

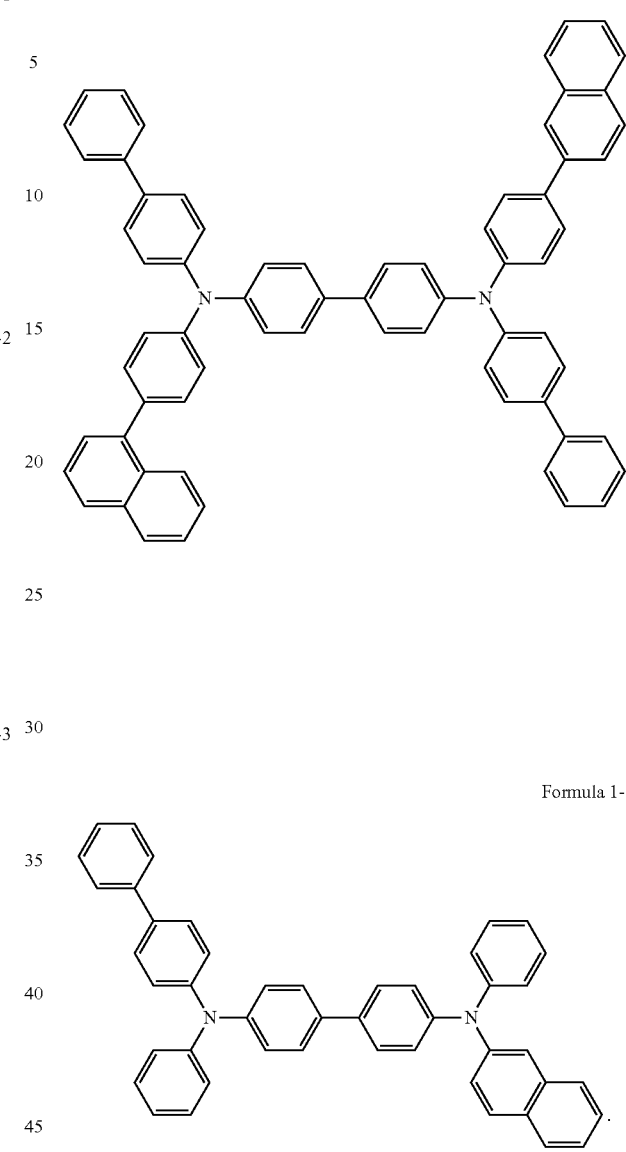

Formula 1-6

In some exemplary embodiments, the material of the electron transporting layer includes a compound having the following structural formula:

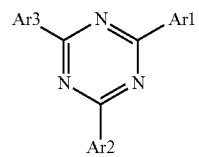

where Ar1, Ar2 and Ar3 are respectively and independently hydrogen, or deuterium, or substituted or unsubstituted alkyl group with 1 to 40 carbon atoms, or substituted or unsubstituted aryl group with 6 to 60 carbon atoms, or are combined with adjacent substituent groups to form substituted or unsubstituted benzene rings;

Ar3 includes the following structural formula:

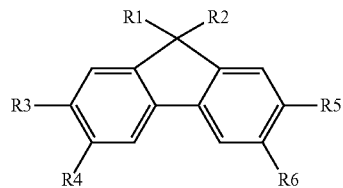

R1 to R6 are respectively and independently one of the following: H, alkyl group with 1 to 6 carbon atoms, amino group, arylam group, substituted or unsubstituted aryl group with 6 to 30 carbon atoms, or substituted or unsubstituted oxyheteroaryl group with 3 to 20 carbon atoms.

In some exemplary embodiments, R1 and R2 are interconnected to form a saturated or unsaturated cyclic compound.

In some exemplary embodiments, the material of the electron transporting layer includes, but is not limited to, compounds having structures expressed by formula 2-1 to formula 2-6:

Formula 2-1

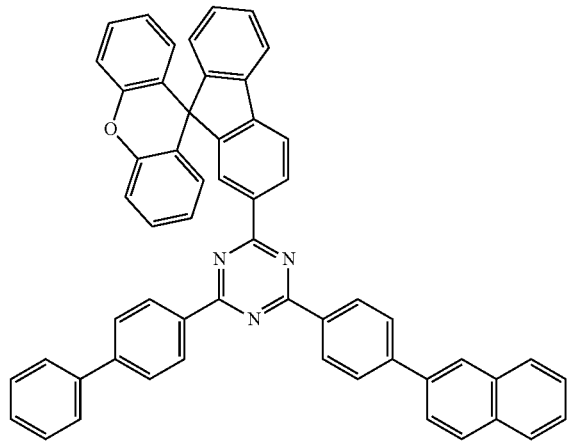

Formula 2-2

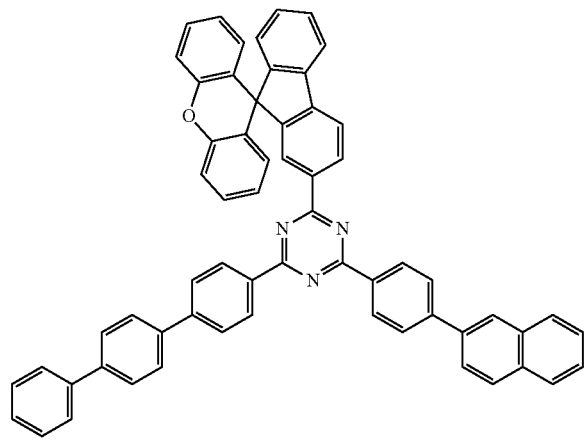

Formula 2-3

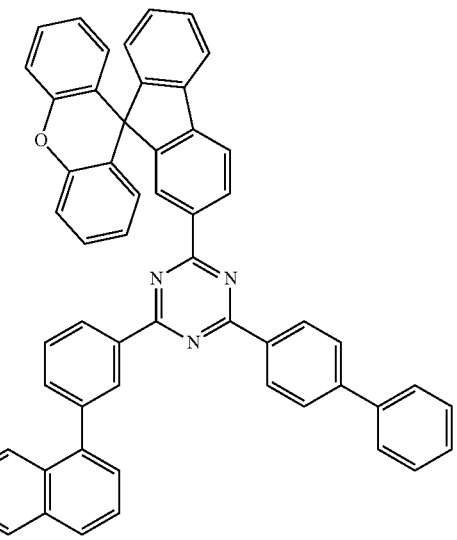

Formula 2-4

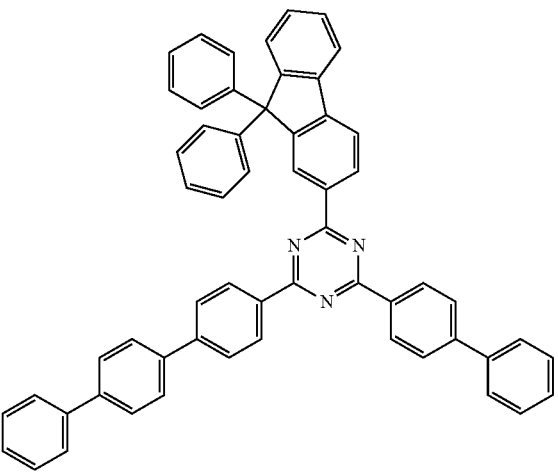

Formula 2-5

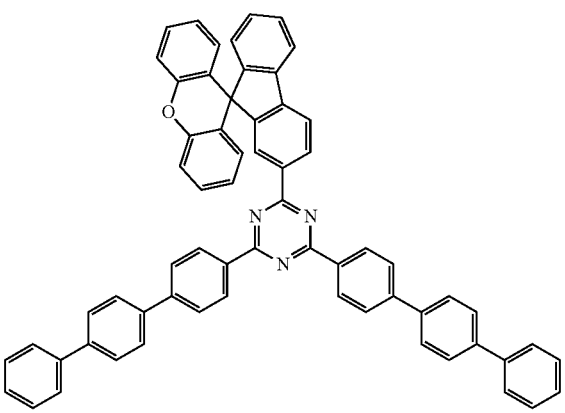

Formula 2-6

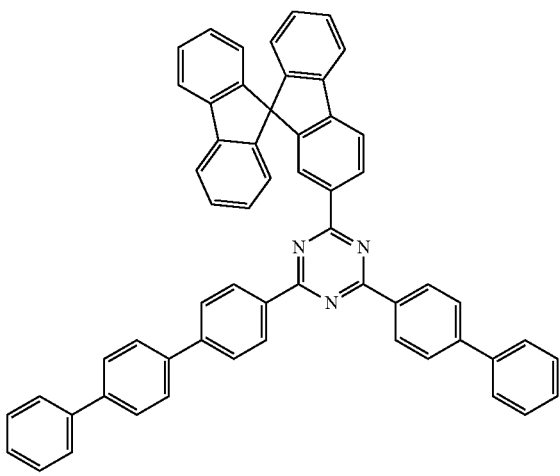

In some exemplary embodiments, the hole transporting layer and the electron blocking layer may be made of other materials known to those skilled in the art that meet the above mobility relationship and energy level relationship, which are not limited in the present disclosure.

Figure 6:
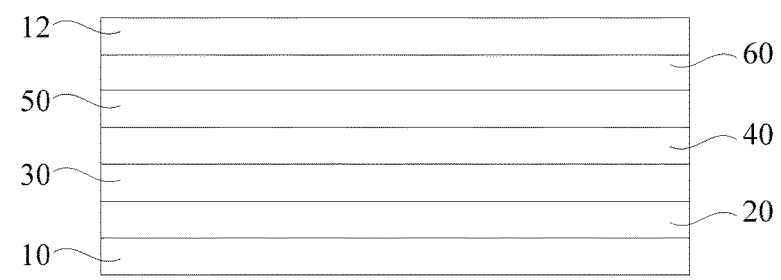
FIG. 6 illustrates a schematic diagram of a structure of another OLED according to at least one embodiment of the present disclosure.

FIG. 6 illustrates a schematic diagram of a structure of another OLED according to at least one embodiment of the present disclosure. Referring to FIG. 6, the OLED in this exemplary embodiment includes a first electrode 10, a second electrode 12, and an organic emitting layer disposed between the first electrode 10 and the second electrode 12. In some exemplary embodiments, the first electrode 10 is an anode and the second electrode 12 is a cathode. The organic emitting layer includes a hole transporting layer 20, an electron blocking layer 30, an emitting layer 40, a hole blocking layer 50 and an electron transporting layer 60 which are stacked. The hole transporting layer 20 and the electron blocking layer 30 are disposed between the first electrode 10 and the emitting layer 40. The hole transporting layer 20 is connected with the first electrode 10. The electron blocking layer 30 is connected with the emitting layer 40. The hole blocking layer 50 and the electron transporting layer 60 are disposed between the emitting layer 40 and the second electrode 12. The hole blocking layer 50 is connected with the emitting layer 40. The electron transporting layer 60 is connected with the second electrode 12. However, this embodiment is not limited thereto. In some examples, a hole injection layer may be further disposed between the hole transporting layer and the first electrode, and an electron injection layer may be further disposed between the electron transporting layer and the second electrode. The hole injection layer can reduce the barrier of hole injection from the first electrode, such that the holes can be effectively injected into the emitting layer from the first electrode. The electron injection layer can reduce the barrier of electron injection from the second electrode, such that electrons can be effectively injected into the emitting layer from the second electrode.

In some exemplary embodiments, the hole transporting layer 20 is configured to achieve directional and orderly controlled migration of injected holes. The electron blocking layer 30 is configured to form a migration barrier for electrons to prevent electrons from migrating out of the emitting layer 40. The emitting layer 40 is configured to make electrons and holes recombined to emit light. The hole blocking layer 50 is configured to form a migration barrier for holes to prevent the holes from migrating out of the emitting layer 40. The electron transporting layer 60 is configured to achieve directional and orderly controlled migration of injected electrons.

In some exemplary embodiments, the HOMO energy level difference between the hole transporting layer 20 and the electron blocking layer 30 is greater than the LUMO energy level between the electron transporting layer 60 and the hole blocking layer 50. In some examples, the HOMO energy level difference between the hole transporting layer 20 and the electron blocking layer 30 is about 0.1 eV to 0.6 eV, and the LUMO energy level difference between the electron transporting layer and the hole blocking layer is about 0.2 eV to 0.7 eV. However, this embodiment is not limited thereto.

In some exemplary embodiments, the materials and structures of the hole transporting layer and the electron transporting layer are the same or similar to those of the above embodiments, which will not be repetitively described here.

In some exemplary embodiments, the anode may be made of a material with a high work function. For a bottom emission type, the anode may be made of a transparent oxide material such as ITO or IZO, and the anode may have a thickness of about 80 nm to 200 nm. For a top emission type, the anode may be made of a compound structure of metal and transparent oxide, such as AG/ITO, Ag/IZO or ITO/Ag/ITO, the metal layer in the anode may have a thickness of about 80 nm to 100 nm, and the transparent oxide in the anode may have a thickness of about 5 nm to 20 nm, such that the average reflectivity of the anode in a visible light region is about 85% to 95%.

In some exemplary embodiments, for a top emission type OLED, the cathode may be made of a metal material and formed through an evaporation process, the metal material may be magnesium (Mg), silver (Ag) or aluminum (Al), or an alloy material, such as Mg: Ag alloy, the Mg: Ag ratio is about 9:1 to 1:9, and the cathode may have a thickness of about 10 nm to 20 nm, such that the average transmittance of the cathode at wavelength of 530 nm is about 50% to 60%. For a bottom emission type OLED, the cathode may be made of magnesium (Mg), silver (Ag), aluminum (Al) or Mg: Ag alloy, and the cathode may have a thickness of about more than 80 nm, such that the cathode has good reflectivity.

In some exemplary embodiments, the hole injection layer may be made of inorganic oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide or manganese oxide, or may be made of a p-type dopant of a strong electron absorption system and a dopant of a hole transport material, such as hexacyanohexaazatriphenylene, 2,3,5,6-tetrafluoro-7,7',8,8'-tetracyanoquinodimethane (F4-TCNQ), or 1,2,3-tri[(cyano) (4-cyano-2,3,5,6-tetrafluorophenyl) methylene]cyclopropane. In some examples, the hole injection layer may have a thickness of about 5 nm to 20 nm.

In some exemplary embodiments, the electron blocking layer may be made of a material of an electron-rich system containing a phenylamine structure, for example, a triphenylamine organic small-molecular material.

In some exemplary embodiments, the material of the emitting layer may include one material, or may include more than two mixed materials. Light emitting materials are divided into blue light emitting materials, green light emitting materials and red light emitting materials. The blue light emitting materials may be selected from pyrene derivatives, anthracene derivatives, fluorene derivatives, perylene derivatives, styrylamine derivatives or metal complexes, for example, N1, N6-di([1,1'-biphenyl]-2-yl)-N1, N6-di([1,1'-biphenyl]-4-yl) pyrene-1,6-diamine, 9,10-di-(2-naphthyl) anthracene (ADN), 2-methyl-9,10-di-2-naphthyl anthracene (MADN), 2,5,8,11-tetratert-butyl perylene (TBPe), 4,4'-di [4-(diphenylamino) styryl]biphenyl (BDAV Bi), 4,4'-di[4-(diphenylamino) styryl]biphenyl (DPAVBi), and di(4,6-difluorophenylpyridine-C2,N) pyridine formyl iridium (FIrpic). The green light emitting materials may be selected from coumarin dyes, quinacridine copper derivatives, polycyclic aromatic hydrocarbons, diamine anthracene derivatives, carbazole derivatives or metal complexes, for example, coumarin 6 (C-6), coumarin 545T (C-525T), quinacridine copper (QA), N,N'-dimethylquinacridone (DMQA), 5,12-diphenylnaphtho naphthalene (DPT), N10, N10'-diphenyl-N10,N10'-dibenzoyl-9,9'-dianthracene-10, 10'-diamine (BA-NPB), tris (8-hydroxyquinoline) aluminum (III) (Alq3), and tris (2-phenylpyridine) iridium (Ir (ppy)$_3$) acetylpyruvate bis(2-phenylpyridine) iridium (Ir (ppy)$_2$(acac)). The red light emitting material may be selected from, for example, DCM series materials or metal complexes, for example, 4-(dicyanomethylene)-2-methyl-6-(4-dimethylaminostyryl)-4H-pyran (DCM), 4-(dicyanomethylene)-2-tert-butyl-6-(1,1,7,7-tetramethyllauronidine-9-enyl)-4H-pyran (DCJTB), di(1-phenylisoquinoline) (acetylacetone) iridium (III) (Ir(piq)$_2$(acac)), octaethylporphyrin platinum (PtOEP), di(2-(2'-benzothiophenyl) pyridine-N,C3') (acetylacetone) iridium (Ir(btp)$_2$(acac), etc.

In some exemplary embodiments, the hole blocking layer may be made of aromatic heterocyclic compounds, for example, imidazole derivatives such as benzimidazole derivatives, imidazolopyridine derivatives, and benzimidazolophenanthridine derivatives; azine derivatives such as pyrimidine derivatives and triazine derivatives; compounds containing a nitrogen-containing six-membered ring structure such as quinoline derivatives, isoquinoline derivatives and phenanthroline derivatives (also including compounds with a phosphine oxide substituent group on a heterocyclic ring), for example, 2-(4-biphenyl)-5-(4-tert-butylphenyl)-1, 3,4-oxadiazole (PBD), 1,3-bis[5-(p-tert-butylphenyl)-1,3,4-oxadiazole-2-yl]benzene (OXD-7), 3-(4-tert-butylphenyl)-4-phenyl-5-(4-biphenyl)-1,2,4-triazole (TAZ), 3-(4-tert-butylphenyl)-4-(4-ethylphenyl)-5-(4-biphenyl)-1,2,4-triazole (p-EtTAZ), bathophenanthroline (BPhen), bathocuproine (BCP) or 4,4'-bis(5-methylbenzoxazole-2-yl) stilbene (BzOs), etc.

In some exemplary embodiment, the hole blocking layer may have a thickness of about 1 nm-15 nm.

In some exemplary embodiments, the electron injection layer may be made of an alkali metal or metal, such as lithium fluoride (LiF), ytterbium (Yb), magnesium (Mg) or calcium (Ca), or compounds of these alkali metals or metals. In some examples, the electron injection layer may have a thickness of about 0.5 nm to 2 nm.

In some exemplary embodiments, the OLED may include a packaging layer, which may be packaged by using a cover plate or a thin film.

In some exemplary embodiments, for a top emission type OLED, the thickness of the organic emitting layer between the cathode and the anode may be designed according to the optical path requirement of the optical micro resonant cavity to obtain the optimal light intensity and color.

In some exemplary embodiments, a display substrate including the OLED as illustrated in FIG. 6 may be manufactured by adopting the following manufacturing method.

First, a drive circuit layer is formed on a substrate through a patterning process. The drive circuit layer of each sub-pixel may include a drive transistor and a storage capacitor which form the pixel drive circuit. Then, a flat layer is formed on the substrate on which the above structure is formed. A via exposing a drain electrode of the drive transistor is formed in the flat layer of each sub-pixel. Then, an anode is formed through a patterning process on the substrate on which the above structure is formed. The anode of each sub-pixel is connected with the drain electrode of the drive transistor through the via in the flat layer. Then, a pixel definition layer is formed through a patterning process on the substrate on which the above structure is formed. A pixel opening exposing the anode is formed in the pixel definition layer of each sub-pixel. Each pixel opening is used as a light emitting region of each sub-pixel.

Then, a hole transporting layer is evaporated by using an open mask on the substrate on which the above structure, and a connected layer of the hole transporting layers is formed on the display substrate, that is, the hole transporting layers of all sub-pixels are connected. For example, the display substrate on which the anode and the pixel definition layer are formed is treated by ultrasonic in a cleaning agent, washed in deionized water, degreased by ultrasonic in acetone-ethanol mixed solvent, and baked in a clean environment until water is completely removed. Then, the treated display substrate is placed in a vacuum chamber and vacuumized to $1*10^{-5}$ to $1*106$ Pa. The hole transporting layer is evaporated in vacuum on an anode film layer. The evaporation rate is about 0.1 nm/s and the evaporated film has a thickness of about 100 nm.

Then, an electron blocking layer and a red emitting layer, an electron blocking layer and a green emitting layer, and an electron blocking layer and a blue emitting layer are respectively evaporated on different sub-pixels by adopting a fine metal mask. The electron blocking layers and the emitting layers of adjacent sub-pixels may overlap a small amount (for example, the overlap part accounts for less than 10% of the area of the respective emitting layer pattern), or may be isolated. In some examples, In some examples, the electron blocking layer may be made of a spirofluorene material with a thickness of about 3 nm to 10 nm. In some examples, the emitting layer includes a host material and a dopant material, and the weight ratio of the host material and the dopant material is about 90:10. The host material may be naphthalene and anthracene compounds, and the dopant material may be fluorene, pyrene and other compounds. In some examples, the emitting layer may be evaporated by adopting a multi-source co-evaporation method, and the doping ratio may be adjusted by controlling the evaporation rate of the dopant material in the evaporation process, or by controlling the evaporation rate ratio of the host material and the dopant material. For example, the evaporation rate of the host material is about 0.1 nm/s, and the evaporation rate of the dopant material is about 10% of the evaporation rate of the host material. In some examples, the thickness of the emitting layer ranges from about 10 nm to 50 nm. For example, the thickness of the emitting layer is about 30 nm.

Then, a hole blocking layer, an electron transporting layer and a cathode are sequentially evaporated by adopting an open mask. Connected layers of the hole blocking layers, the electron transporting layers and the cathodes are formed on the display substrate, that is, the hole blocking layers of all sub-pixels are connected, the electron transporting layers of all sub-pixels are connected, and the cathodes of all sub-pixels are connected. In some examples, the evaporation rate of the hole blocking layer may be about 0.05 nm/s and the film has a thickness of about 1 nm; the evaporation rate of the electron transporting layer is about 0.1 nm/s and the film has a thickness of about 10 nm to 30 nm.

In some exemplary embodiments, an orthographic projection of one or more of the hole injection layers, the hole transporting layers, the hole blocking layers, the electron transporting layers, the electron injection layers and the cathodes on the substrate is continuous. In some examples, at least one of the hole injection layers, the hole transporting layers, the hole blocking layers, the electron transporting layers, the electron injection layers and the cathodes in at least one row or column of sub-pixels is connected. In some examples, at least one of the hole injection layers, the hole transporting layers, the hole blocking layers, the electron transporting layers, the electron injection layers and the cathodes of a plurality of sub-pixels is connected.

In some exemplary embodiments, the organic emitting layer may include a microcavity adjustment layer located between the hole transporting layer and the emitting layer. For example, after the hole transporting layer is formed, a red microcavity adjustment layer and a red emitting layer, a green microcavity adjustment layer and a green emitting layer, and a blue microcavity adjustment layer and a blue emitting layer may be respectively evaporated on different sub-pixels by using a fine metal mask. In some examples, the red microcavity adjustment layer, the green microcavity adjustment layer and the blue microcavity adjustment layer may include an electron blocking layer.

In some exemplary embodiments, the orthographic projections of the emitting layers of at least partial sub-pixels on the substrate overlap with the orthographic projection of the pixel drive circuit on the substrate.

Table 1 shows the performance comparison results of several film layer material combination structures of the exemplary embodiment of the present disclosure. In the comparison experiment, the structures of the organic emitting layers of the comparative structures 1 to 3 and the exemplary structures 1 to 3 are all HTL/EBL/EML/HBL/ETL; the thickness of the corresponding film layers of the comparative structures 1 to 3 and the exemplary structures 1 to 3 are the same, and the materials of the electron blocking layer EBL, the emitting layer EML and the hole blocking layer HBL of the comparative structures 1 to 3 and the exemplary structures 1 to 3 are respectively the same. LT95 in the table represents the time when the OLED decreases from the initial brightness (100%) to 95%. Since the service life curve follows the multi-exponential attenuation model, the service life of the OLED may be estimated according to LT95.

The related materials of the film layers of the same material in the comparative structures 1 to 3 and the exemplary structures 1 to 3 are as follows:

| Item | Material |
|---|---|
| Electron blocking layer EBL | mCBP |
| Emitting layer EML | Host material: 4,4'-bis(9-carbazolyl)biphenyl |
|  | Dopant material: TBPe |
| Hole blocking layer HBL | BCP |

The materials of the hole transporting layers and the electron transporting layers of the comparative structures 1 to 3 and the exemplary structures 1 to 3 are as follows:

| Hole transporting layer HTL | Electron transporting layer ETL |
|---|---|
| Comparative structure 1 | |

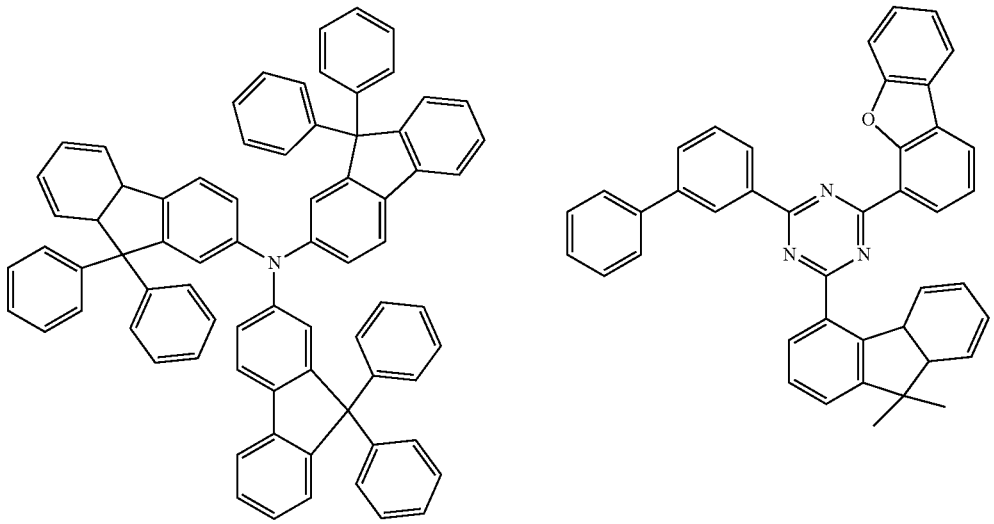

-continued
| Hole transporting layer HTL | Electron transporting layer ETL |
|---|---|
| Comparative structure 2 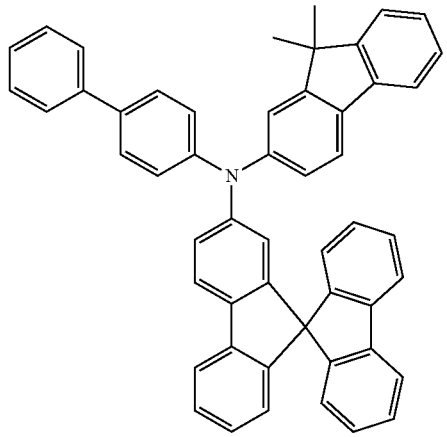 [SMILES: CC1(C)c2ccccc2-c2ccc(N(c3ccc(-c4ccccc4)cc3)c3ccc4c(c3)C3(c5ccccc5-c5ccccc53)c3ccccc3-4)cc21] | 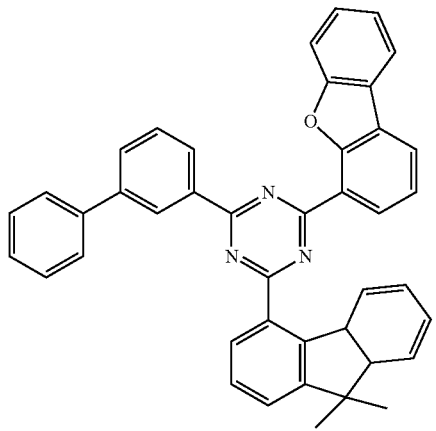 [SMILES: CC1(C)c2cccc(-c3nc(-c4cccc(-c5ccccc5)c4)nc(-c4cccc5c4oc4ccccc45)n3)c2C2C=CC=CC21] |
| Comparative structure 3 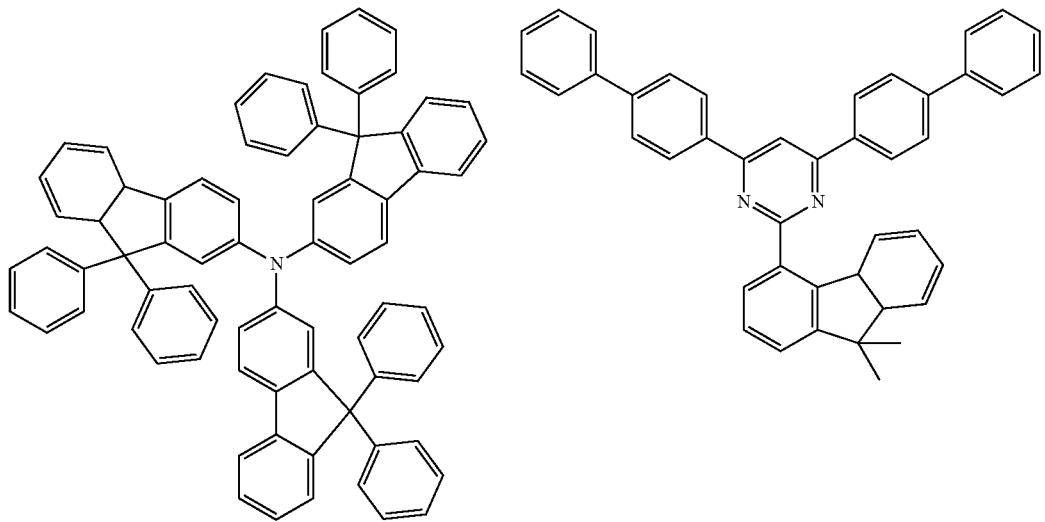 | |
| Exemplary structure 1 Formula 1-2 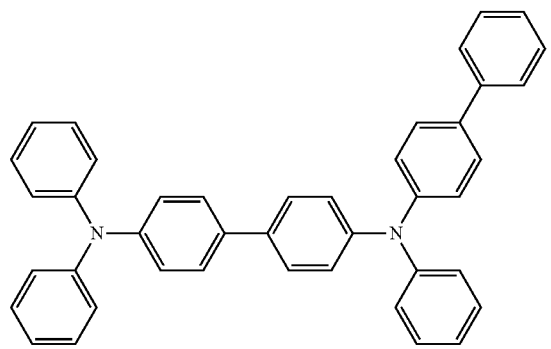 [SMILES: c1ccc(-c2ccc(N(c3ccccc3)c3ccc(-c4ccc(N(c5ccccc5)c5ccccc5)cc4)cc3)cc2)cc1] | Formula 2-5 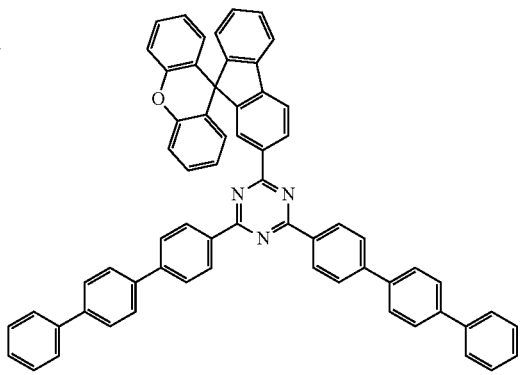 [SMILES: c1ccc(-c2ccc(-c3ccc(-c4nc(-c5ccc(-c6ccc(-c7ccccc7)cc6)cc5)nc(-c5ccc6c(c5)C5(c7ccccc7Oc7ccccc75)c5ccccc5-6)n4)cc3)cc2)cc1] |

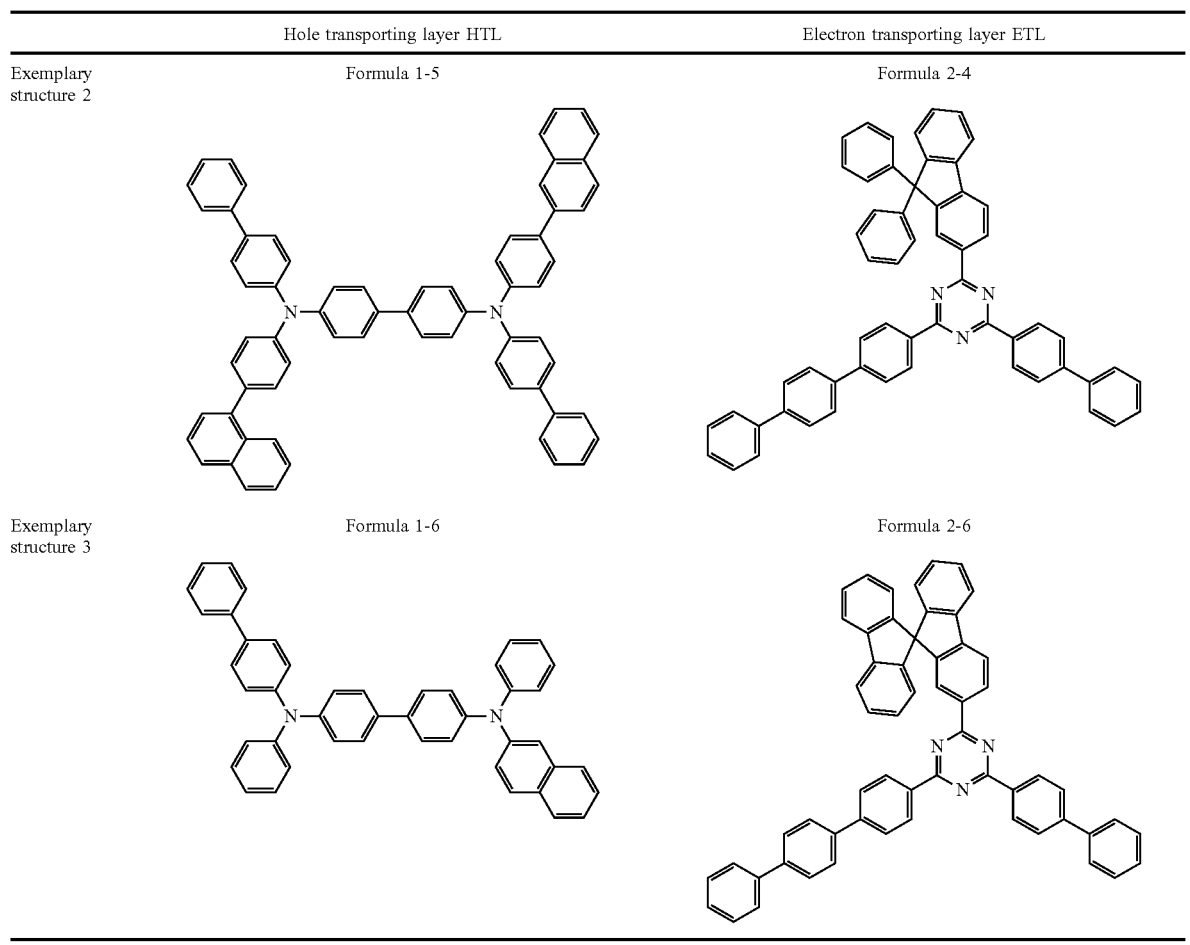

TABLE 1

Performance comparison results of different HTL and ETL materials

| | Efficiency (cd/A) | Service life (LT95) (h) |
|---|---|---|
| Comparative structure 1 | 45.6 | 60 |
| Comparative structure 2 | 48.5 | 62 |
| Comparative structure 3 | 42.3 | 57 |
| Exemplary structure 1 | 52.6 | 65 |
| Exemplary structure 2 | 51.8 | 68 |
| Exemplary structure 3 | 56.4 | 63 |

As shown in Table 1, the exemplary structures 1 to 3 are significantly improved in efficiency and service life compared with the comparative structures 1 to 3. Therefore, this exemplary embodiment adopts the material combination and mobility matching of the hole transporting layer and electron transporting layer, and the service life and efficiency are significantly improved.

Figure 7:
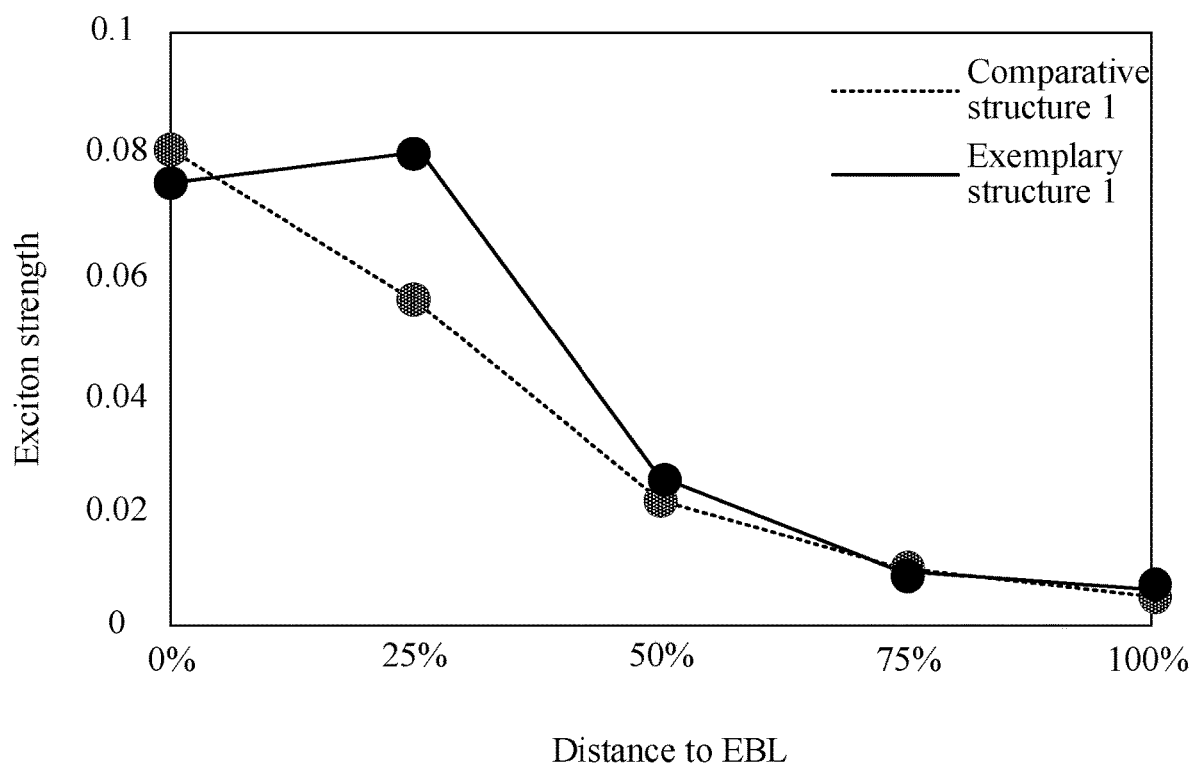
FIG. 7 illustrates a distribution chart of exciton recombination regions of a comparative structure 1 and an exemplary structure 1.

FIG. 7 illustrates a distribution chart of exciton recombination regions of a comparative structure 1 and an exemplary structure 1. Referring to FIG. 7, in the comparative structure 1, the exciton recombination region of the emitting layer is mainly concentrated at 0% of the interface between the electron blocking layer and the emitting layer, resulting in the accumulation of too many electrons at the interface. In the exemplary structure 1, the exciton recombination region of the emitting layer moves to the center of the emitting layer, and the exciton recombination region is far away from the electron blocking layer, which not only reduces the electron accumulation at the interface between the emitting layer and the electron blocking layer, but also reduces the damage to the electron blocking layer, thus improving the service life of OLED devices and improving the luminous efficiency.

By reasonably matching the mobility relationship between the hose transport layer and the electron transporting layer, the exemplary embodiment of the present disclosure optimizes the interface, which is conducive to the transmission of carriers to the center of the emitting layer, reduces the carrier accumulation of the interface, increases the hole concentration in the emitting layer from the mobility relationship, moves the exciton recombination region to the center of the emitting layer, enables the exciton recombination region to be far away from the electron blocking layer, and not only reduces the electron accumulation at the interface between the emitting layer and the electron blocking layer, but also reduces the damage to the electron blocking layer. By configuring the material combination of the electron transporting layer and the hole transporting layer, the exemplary embodiment of the present disclosure increases the hole transport rate from the material, reduces the material deterioration and performance degradation caused by electron accumulation, improves the service life of the device and improves the luminous efficiency.

The embodiment of the present disclosure further provides a display device, which includes the organic light emitting device. The display device may be any product or component with a display function, such as mobile phone, tablet computer, TV, display, notebook computer, digital photo frame, navigator, vehicle-mounted display, smart watch or smart bracelet.

In some exemplary embodiments, the display device may include a first organic light emitting device emitting red light, a second organic light emitting device emitting green light, and a third organic light emitting device emitting blue light. For example, the first organic light emitting device includes a first electrode, a second electrode, and a hole injection layer, a hole transporting layer, an electron blocking layer, a first emitting layer, a hole blocking layer, an electron transporting layer and an electron injection layer which are sequentially disposed between the first electrode and the second electrode. The second organic light emitting device includes a first electrode, a second electrode, and a hole injection layer, a hole transporting layer, an electron blocking layer, a second emitting layer, a hole blocking layer, an electron transporting layer and an electron injection layer which are sequentially disposed between the first electrode and the second electrode. The third organic light emitting device includes a first electrode, a second electrode, and a hole injection layer, a hole transporting layer, an electron blocking layer, a third emitting layer, a hole blocking layer, an electron transporting layer and an electron injection layer which are sequentially disposed between the first electrode and the second electrode. The materials of the first emitting layer, the second emitting layer and the third emitting layer are different. The materials of the hole injection layers, the hole transporting layers, the hole blocking layers, the electron transporting layers and the electron injection layers of the first organic light emitting device to the third organic light emitting device may be the same. The materials of the electron blocking layers of the first organic light emitting device to the third organic light emitting device may be different. However, this embodiment is not limited thereto.

In some exemplary embodiments, the electron mobility of the emitting layer of the third organic light emitting device is greater than the electron mobility of the emitting layer of the first organic light emitting device, and the electron mobility of the emitting layer of the first organic light emitting device is greater than the electron mobility of the emitting layer of the second organic light emitting device. The hole mobility of the emitting layer of the second organic light emitting device is greater than the hole mobility of the emitting layer of the first organic light emitting device, and the hole mobility of the emitting layer of the first organic light emitting device is greater than the hole mobility of the emitting layer of the third organic light emitting device.

In some exemplary embodiments, the emitting layer of the first organic light emitting device has a thickness of about 30 nm to 45 nm. The emitting layer of the second organic light emitting device has a thickness of about 30 nm to 40 nm. The emitting layer of the third organic light emitting device has a thickness of about 20 nm to 35 nm.

In some exemplary embodiments, the drive voltage of the third organic light emitting device is higher than the drive voltage of the second organic light emitting device, and the drive voltage of the second organic light emitting device is higher than the drive voltage of the first organic light emitting device. For example, the drive voltage of the third organic light emitting device is about 2.8V to 3.2V, the drive voltage of the second organic light emitting device is about 2.6V to 3.0V, and the drive voltage of the first organic light emitting device is about 2.4V to 3.0V. However, this embodiment is not limited thereto.

In some exemplary embodiments, the luminous efficiency of the second organic light emitting device is higher than the luminous efficiency of the first organic light emitting device, and the luminous efficiency of the first organic light emitting device is higher than the luminous efficiency of the third organic light emitting device. For example, the luminous efficiency of the second organic light emitting device is about 130cd/A to 150cd/A, the luminous efficiency of the first organic light emitting device is about 70cd/A to 100cd/A, and the luminous efficiency of the third organic light emitting device is about 15cd/A to 30cd/A. However, this embodiment is not limited thereto.

In regard to the structures of the first organic light emitting device, the second organic light emitting device and the third organic light emitting device in this embodiment, a reference may be made to the description of the organic light emitting device in the above embodiment, which will not be repetitively described here.

Although the embodiments disclosed in the present disclosure are as above, the content described is only for the convenience of understanding the present disclosure and is not used to limit the present disclosure. Those skilled in the art may make any modification and change in the form and details of the implementation without departing from the spirit and scope of the present disclosure. However, the scope of protection of the present disclosure should still be subject to the scope defined by the attached claims.

What we claim is:

1. An organic light emitting device, comprising: a first electrode, a second electrode, an emitting layer disposed between the first electrode and the second electrode, a hole transporting layer disposed between the first electrode and the emitting layer, and an electron transporting layer disposed between the second electrode and the emitting layer; wherein
    the ratio of the hole mobility of the hole transporting layer to the electron mobility of the electron transporting layer is about 10 to 500;
    wherein the material of the electron transporting layer comprises a compound having the following structural formula:

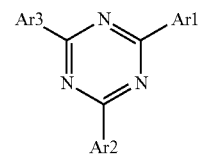

where Ar1, Ar2 and Ar3 are respectively and independently hydrogen, or deuterium, or substituted or unsubstituted alkyl group with 1 to 40 carbon atoms, or substituted or unsubstituted aryl group with 6 to 60 carbon atoms, or are combined with adjacent substituent groups to form substituted or unsubstituted benzene rings; Ar3 comprises the following structural formula:

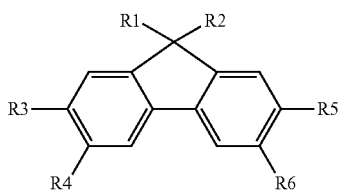

R1 to R6 are respectively and independently one of the following: H, alkyl group with 1 to 6 carbon atoms, amino group, arylamino group, substituted or unsubstituted aryl group with 6 to 30 carbon atoms, or substituted or unsubstituted oxyheteroaryl group with 3 to 20 carbon atoms;

wherein R1 and R2 are interconnected by using an oxygen atom to form a saturated or unsaturated cyclic compound;

wherein the material of the electron transporting layer comprises one or more compounds having the following structural formulas:

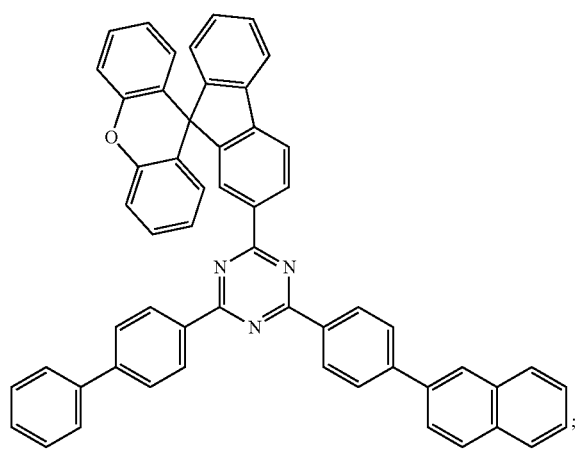

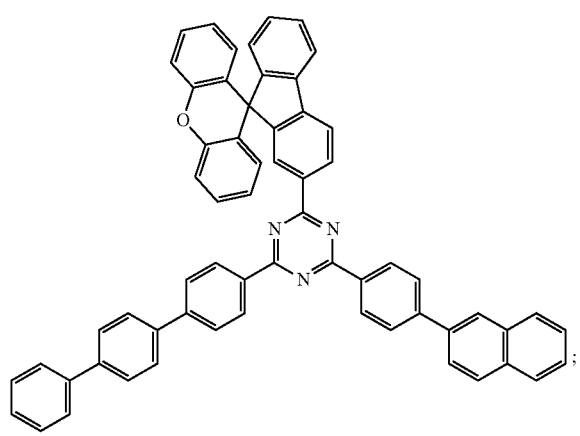

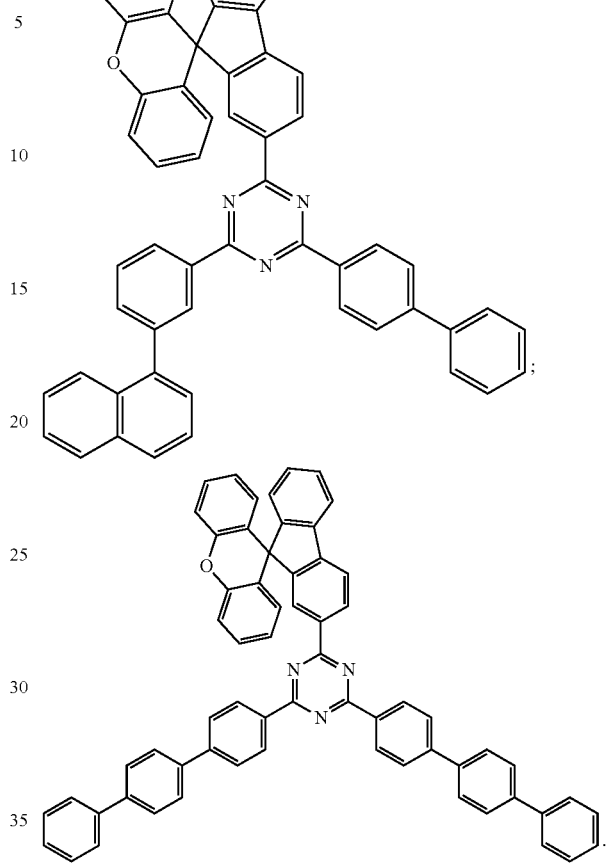

2. The organic light emitting device according to claim 1, wherein the hole mobility of the hole transporting layer is about $5*10^{-5}$ cm$^2$/Vs to $9*10^{-4}$ cm$^2$/Vs.

3. The organic light emitting device according to claim 1, wherein the electron mobility of the electron transporting layer is about $1*10^{-6}$ cm$^2$/Vs to $5*10^{-5}$ cm$^2$/Vs.

4. The organic light emitting device according to claim 1, wherein the Highest Occupied Molecular Orbit (HOMO) energy level difference between the hole transporting layer and an adjacent layer on the side far away from the first electrode is greater than the Lowest Unoccupied Molecular Orbit (LUMO) energy level difference between the electron transporting layer and an adjacent layer on the side far away from the second electrode.

5. The organic light emitting device according to claim 4, wherein the HOMO energy level difference between the hole transporting layer and the adjacent layer on the side far away from the first electrode is about 0.1 eV to 0.6 eV.

6. The organic light emitting device according to claim 4, wherein the LUMO energy level difference between the electron transporting layer and the adjacent layer on the side far away from the second electrode is about 0.2 eV to 0.7 eV.

7. The organic light emitting device according to claim 1, wherein the material of the hole transporting layer comprises a compound having the following structural formula:

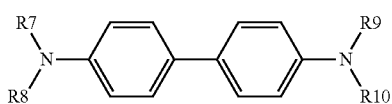

where R7 to R10 are respectively and independently one of the following: substituted or unsubstituted aryl group with 6 to 30 carbon atoms, substituted or unsubstituted heteroaryl group with 3 to 30 carbon atoms, substituted or unsubstituted alkyl group with 1 to 20 carbon atoms, and substituted or unsubstituted cycloalkyl group with 1 to 20 carbon atoms.

8. The organic light emitting device according to claim 7, wherein R7 to R10 are at least partially the same or different from each other.

9. The organic light emitting device according to claim 7, wherein the material of the hole transporting layer comprises one or more compounds having the following structural formulas:

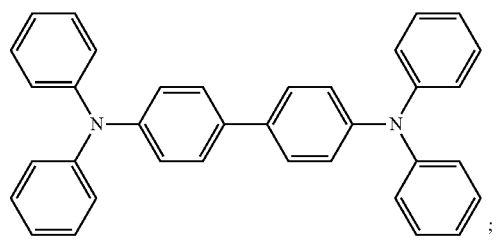

;

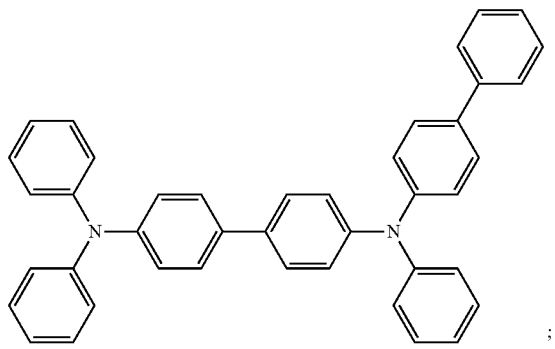

;

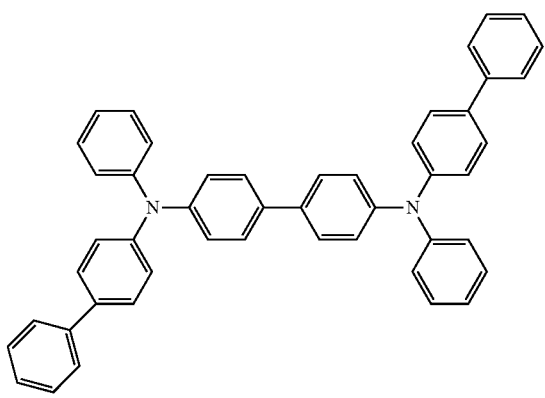

;

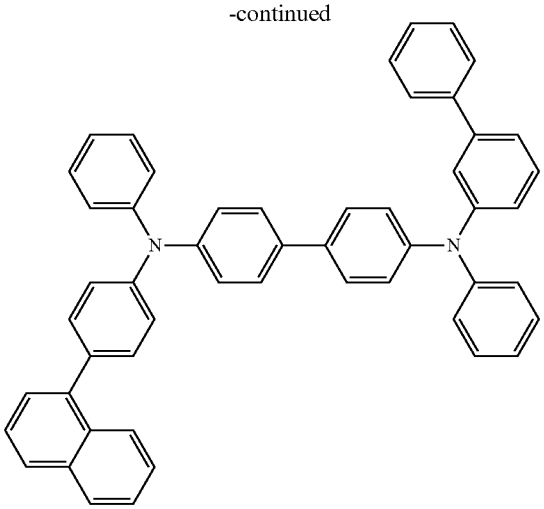

;

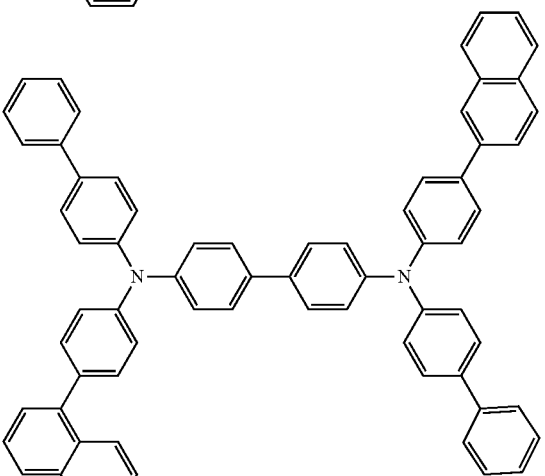

;

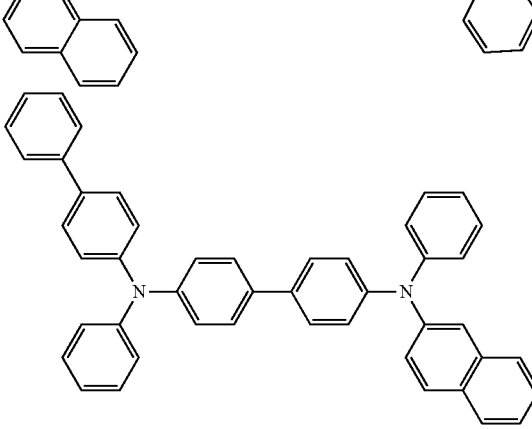

.

10. A display device, comprising the organic light emitting device according to claim 1.

11. The display device according to claim 10, wherein the display device comprises a first organic light emitting device emitting red light, a second organic light emitting device emitting green light, and a third organic light emitting device emitting blue light.

12. The display device according to claim 11, wherein the electron mobility of the emitting layer of the third organic light emitting device is greater than the electron mobility of the emitting layer of the first organic light emitting device, and the electron mobility of the emitting layer of the first organic light emitting device is greater than the electron mobility of the emitting layer of the second organic light emitting device; and the hole mobility of the emitting layer of the second organic light emitting device is greater than the hole mobility of the emitting layer of the first organic light emitting device, and the hole mobility of the emitting layer of the first organic light emitting device is greater than the hole mobility of the emitting layer of the third organic light emitting device.

13. The display device according to claim 11, wherein the drive voltage of the third organic light emitting device is greater than the drive voltage of the second organic light emitting device, and the drive voltage of the second organic light emitting device is greater than the drive voltage of the first organic light emitting device.

14. The display device according to claim 11, wherein the luminous efficiency of the second organic light emitting device is greater than luminous efficiency of the first organic light emitting device, and the luminous efficiency of the first organic light emitting device is greater than luminous efficiency of the third organic light emitting device.

15. A display device, comprising the organic light emitting device according to claim 2.

16. A display device, comprising the organic light emitting device according to claim 3.

\* \* \* \* \*